(12) United States Patent
Cho et al.

(10) Patent No.: US 10,709,051 B2
(45) Date of Patent: Jul. 7, 2020

(54) ELECTRONIC DEVICE INCLUDING COMPONENT SEPARATION STRUCTURE

(71) Applicant: Samsung Electronics Co., Ltd., Suwon-si, Gyeonggi-do (KR)

(72) Inventors: Sung-Gun Cho, Hwaseong-si (KR); Daehyeong Park, Seongnam-si (KR); Jong-Min Choi, Seongnam-si (KR); Jaehee Kim, Seongnam-si (KR); Hyunjong Lee, Incheon (KR); Uyhyeon Jeong, Suwon-si (KR); Daum Hwang, Suwon-si (KR); Seunghyun Hwang, Yongin-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 105 days.

(21) Appl. No.: 15/914,648

(22) Filed: Mar. 7, 2018

(65) Prior Publication Data

US 2018/0263151 A1   Sep. 13, 2018

(30) Foreign Application Priority Data

Mar. 10, 2017 (KR) ........................ 10-2017-0030525

(51) Int. Cl.
*H05K 13/04* (2006.01)
*B23P 19/04* (2006.01)
(Continued)

(52) U.S. Cl.
CPC .......... *H05K 13/0486* (2013.01); *B23P 19/04* (2013.01); *B32B 7/06* (2013.01); *G06F 1/1658* (2013.01); *H01M 2/1066* (2013.01); *H04B 1/3888* (2013.01); *H04M 1/0262* (2013.01); *H01M 2220/30* (2013.01)

(58) Field of Classification Search
None
See application file for complete search history.

(56) References Cited

U.S. PATENT DOCUMENTS 9,023,511 B1 * 5/2015 Chamberlain ...... H01M 2/1066
                                                        429/163
9,333,706 B2 * 5/2016 Mag ....................... B29C 65/50
(Continued)

FOREIGN PATENT DOCUMENTS

CN    104576990 A    4/2015
JP    2011-042739 A  3/2011
(Continued)

OTHER PUBLICATIONS

European Search Report dated Jul. 17, 2018, issued in European Patent Application No. 18160852.2.

*Primary Examiner* — Dimary S Lopez Cruz
(74) *Attorney, Agent, or Firm* — Jefferson IP Law, LLP

(57) ABSTRACT

An electronic device is provided. The electronic device includes a housing having a first surface and a second surface facing the first surface, a display of which at least part of the display is disposed in the housing in a second surface direction, and a battery of which at least part of the battery is disposed in the housing in a first surface direction. The housing includes a battery mounting portion whose recess is provided in the first surface. The battery is attached to the battery mounting portion by an adhesive member.

20 Claims, 21 Drawing Sheets

(51) Int. Cl.
*B32B 7/06* (2019.01)
*G06F 1/16* (2006.01)
*H04B 1/3888* (2015.01)
*H01M 2/10* (2006.01)
*H04M 1/02* (2006.01)

(56) References Cited

U.S. PATENT DOCUMENTS

| | | | | |
|---|---|---|---|---|
| 9,448,591 B2* | 9/2016 | Leong | | G06F 1/1635 |
| 10,084,165 B2* | 9/2018 | Fukushima | | H04N 5/2252 |
| 2002/0027010 A1* | 3/2002 | Glenn | | H01L 21/56 |
| | | | | 174/524 |
| 2009/0274953 A1* | 11/2009 | Myers | | H01M 2/1066 |
| | | | | 429/100 |
| 2011/0151945 A1* | 6/2011 | Jiang | | H01M 2/1066 |
| | | | | 455/575.1 |
| 2011/0223447 A1* | 9/2011 | Ignor | | H01M 2/0207 |
| | | | | 429/7 |
| 2012/0307465 A1* | 12/2012 | Schreffler | | H05K 3/32 |
| | | | | 361/760 |
| 2014/0123459 A1 | 5/2014 | Casebolt et al. | | |
| 2014/0160712 A1 | 6/2014 | Cao | | |
| 2014/0355207 A1* | 12/2014 | Stephens | | H01M 10/425 |
| | | | | 361/679.55 |
| 2015/0077909 A1* | 3/2015 | Filiz | | G06F 1/1637 |
| | | | | 361/679.01 |
| 2015/0228944 A1* | 8/2015 | Lin | | H01M 2/1066 |
| | | | | 429/100 |

FOREIGN PATENT DOCUMENTS

| | | |
|---|---|---|
| JP | 2016-065210 A | 4/2016 |
| KR | 10-2015-0051357 A | 5/2015 |
| KR | 10-2016-0098145 A | 8/2016 |

* cited by examiner

ELECTRONIC DEVICE INCLUDING COMPONENT SEPARATION STRUCTURE

CROSS-REFERENCE TO RELATED APPLICATION(S)

This application claims the benefit under 35 U.S.C. § 119(a) of a Korean patent application filed on Mar. 10, 2017 in the Korean Intellectual Property Office and assigned Serial number 10-2017-0030525, the entire disclosure of which is hereby incorporated by reference.

TECHNICAL FIELD

The present disclosure relates to an electronic device. More particularly, the present disclosure relates to a component separation structure.

BACKGROUND

Electronic devices are gradually becoming slim to meet a consumer's need for purchase, and are being improved to increase the rigidity of the electronic device, and enhance a design aspect thereof and to concurrently differentiate a functional element thereof.

Electronic components disposed within the electronic device are on the trend of being designed to have a robust structure that can be resistant even to external impact such as falling of the electronic device. Particularly, a battery (e.g., a battery pack, a battery cell, etc.) disposed within the electronic device among the electronic components is important to have an improved impact resistant structure that can be resistant to external impact.

The battery can be attached to a housing of the electronic device using an adhesive member of excellent impact resistance and adhesiveness performance. So, a structure for making battery separation smooth at battery replacement should be taken into consideration for the sake of future maintenance.

The above information is presented as background information only to assist with an understanding of the present disclosure. No determination has been made, and no assertion is made, as to whether any of the above might be applicable as prior art with regard to the present disclosure.

SUMMARY

The electronic device may include a plurality of electronic components (i.e., electronic function group) disposed therein, and may exhibit various functions of the electronic device by using the corresponding components. The above electronic components may be fixed to an adherent of the electronic device (e.g., a housing of the electronic device, a bracket thereof, etc.) by means of bonding, taping, screw coupling, mechanical structure coupling or the like. The electronic components may be disposed to have a physical property of excellent impact resistance capable of enduring external impact. The electronic device needs to separate the electronic component fixed and disposed therein for the sake of maintenance in use. The electronic device can have a structure for making battery separation easy in order not to affect peripheral other components at separation work.

Among the aforementioned electronic components, a battery is attached to a housing of the electronic device using an adhesive member (e.g., an adhesive tape, a functional adhesive member, etc.). So, the battery can be separated from the housing in the existing various manners. For example, the battery can be separated from the housing by decreasing a viscous force of viscous materials included in the adhesive member (e.g., decreasing an adhesive strength of the adhesive member) by means of a separation type solvent (e.g., a stripper) that is inputted to at least a part of a boundary region with the housing. However, this separation method may cause a problem that the battery is not smoothly separated from the housing because there is a limit in solvent diffusion in a battery attachment structure having a relatively wide adhesive region.

Also, the battery can be separated by a functional adhesive member that is decreased in its adhesive region if a tension works in a shear direction vertical with an adhesiveness direction of the battery. But, this separation method can cause a problem that the functional adhesive member is fractured before battery separation, because the functional adhesive member has no choice but to generate a tension in a direction different from the shear direction due to battery support ribs recently disposed in the housing for the sake of battery rigidity reinforcement and this brings about an increase of a frictional force with the battery or the rib.

Also, the battery can be coupled to the housing by means of a structural coupling member (e.g., a screw, a bushing, etc.). By separating this, the battery can be separated from the housing. But, this separation method can cause a problem of running counter to a trend of gradual miniaturization and slimming of the electronic device, because the structural coupling member has to be disposed in a space that is separately prepared around a battery installation part of the housing.

Aspects of the present disclosure are to address at least the above-mentioned problems and/or disadvantages and to provide at least the advantages described below. According to an aspect of the present disclosure is to provide an electronic device including a component separation structure.

According to another aspect of the present disclosure, an electronic device is provided including a component separation structure configured to prevent a damage of peripheral components at the time of maintenance and enable a fast separation and assembly operation may be provided.

According to another aspect of the present disclosure, an electronic device is provided including a component separation structure configured to contribute the slimming of the electronic device in that although the component separation structure is installed, a separate space for the component separation structure is not required.

In accordance with an aspect of the present disclosure, an electronic device is provided. The electronic device includes a housing having a first surface and a second surface facing away from the first surface, a display of which at least part of the display is disposed in the housing in a second surface direction, and a battery of which at least part of the battery is disposed in the housing in a first surface direction. The housing may include a battery mounting portion whose recess is provided in the first surface. The battery may be attached to the battery mounting portion by an adhesive member.

According to various embodiments, a first member, a second member attached to the first member by an adhesive member, and a recess for guiding a flow of a solvent for decreasing an adhesive strength of the adhesive member, to at least a part of a region, which overlaps with the second member, among one surface of the first member may be formed.

Other aspects, advantages, and salient features of the disclosure will become apparent to those skilled in the art from the following detailed description, which, taken in conjunction with the annexed drawings, discloses various embodiments of the present disclosure.

BRIEF DESCRIPTION OF THE DRAWINGS

The above and other aspects, features, and advantages of certain embodiments of the present disclosure will be more apparent from the following description taken in conjunction with the accompanying drawings, in which.

Throughout the drawings, it should be noted that like reference numbers are used to depict the same or similar elements, features, and structures.

DETAILED DESCRIPTION

Figure 1:
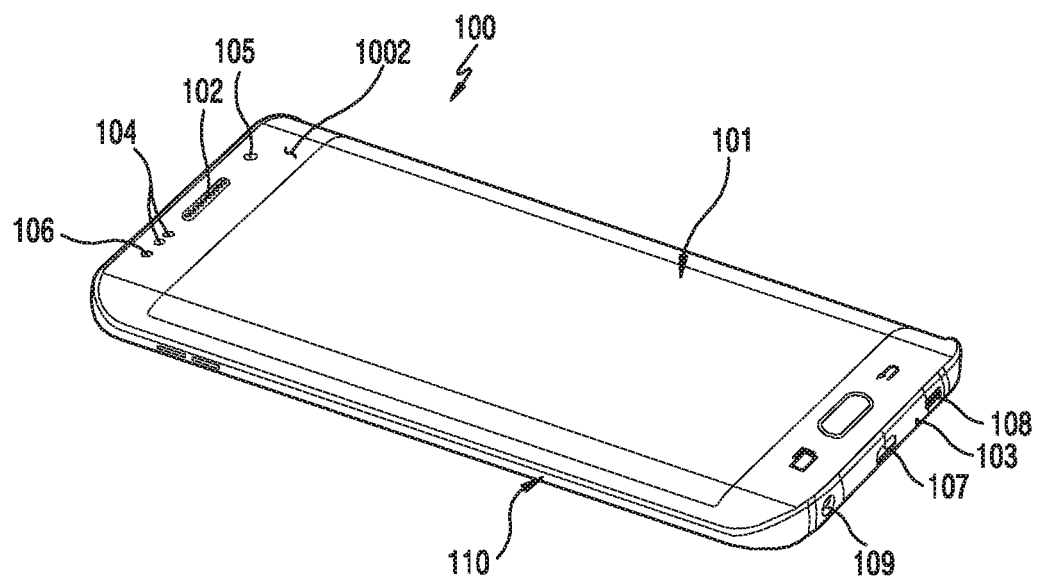
FIG. 1 is a front perspective view of an electronic device according to various embodiments of the present disclosure.

The following description with reference to the accompanying drawings is provided to assist in a comprehensive understanding of various embodiments of the present disclosure as defined by the claims and their equivalents. It includes various specific details to assist in that understanding but these are to be regarded as merely exemplary. Accordingly, those of ordinary skill in the art will recognize that various changes and modifications of the various embodiment described herein can be made without departing from the scope and spirit of the present disclosure. In addition, descriptions of well-known functions and constructions may be omitted for clarity and conciseness.

The terms and words used in the following description and claims are not limited to the bibliographical meanings, but, are merely used by the inventor to enable a clear and consistent understanding of the present disclosure. Accordingly, it should be apparent to those skilled in the art that the following description of various embodiments of the present disclosure is provided for illustration purpose only and not for the purpose of limiting the present disclosure as defined by the appended claims and their equivalents.

It is to be understood that the singular forms "a," "an," and "the" include plural referents unless the context clearly dictates otherwise. Thus, for example, reference to "a component surface" includes reference to one or more of such surfaces.

In the present disclosure, the expressions "have", "may have", "comprise", "may comprise", etc. indicate the existence of a corresponding feature (e.g., a constituent element such as a numerical value, a function, an operation, a component or the like), and do not exclude the existence of an additional feature.

In the present disclosure, the expressions "A or B", "at least one of A or/and B", "one or more of A or/and B" or the like may include all available combinations of words enumerated together. For example, "A or B", "at least one of A and B", or "at least one of A or B" may denote all of the cases of (1) including at least one A, (2) including at least one B, or (3) including all of at least one A and at least one B.

The expressions "1st", "2nd", "first", "second" or the like used in the present disclosure may modify various constituent elements irrespective of order and/or importance, but are merely used to distinguish one constituent element from another constituent element and do not limit the corresponding constituent elements. For example, a first user device and a second user device may represent mutually different user devices, regardless of order or importance. For example, a first constituent element may be named a second constituent element without departing from the scope of right mentioned in the present disclosure. Similarly, even a second constituent element may be interchangeably named a first constituent element.

When it is mentioned that some constituent element (e.g., a first constituent element) is "(operatively or communicatively) coupled with/to" or is "connected to" another constituent element (e.g., a second constituent element), it will have to be understood that some constituent element may be directly coupled to the other constituent element, or be coupled to the other constituent element through a further constituent element (e.g., a third constituent element). On the other hand, when it is mentioned that some constituent element (e.g., a first constituent element) is "directly coupled" or is "directly connected" to another constituent element (e.g., a second constituent element), it may be understood that a further constituent element (e.g., a third constituent element) does not exist between some constituent element and the other constituent element.

The expression "configured (or set) to~" used in the present disclosure may be used interchangeably with, for example, "suitable for~", "having the capacity to~", "designed to~", "adapted to~", "made to~", or "capable of~" according to context. The term "configured (or set) to~" may not necessarily mean only "specifically designed to" in hardware. Instead, in some context, the expression "device configured to~" may mean that the device is "capable of~" together with other devices or components. For example, the phrase "processor configured (or set) to perform A, B, and C" may represent an exclusive processor (e.g., an embedded processor) for performing a corresponding operation, or a generic-purpose processor (e.g., a central processing unit (CPU) or an application processor (AP)) capable of performing corresponding operations by executing one or more software programs stored in a memory device.

The terms used in the present disclosure, terms used to just describe specific various embodiments, may not intend to limit the scope of other various embodiments. The expression of a singular form may include the expression of a plural form unless otherwise dictating clearly in context. The terms used herein inclusive of technological or scientific terms may have the same meaning as those commonly understood by a person having ordinary skill in the art mentioned in the present disclosure. Among the terms used in the present disclosure, the terms defined in a general dictionary may be construed as having the same or similar meanings with the contextual meanings of a related technology. And, the terms defined in the general dictionary are not construed as having ideal or excessively formal meanings unless defined clearly in the present disclosure. According to cases, even the terms defined in the present disclosure cannot be construed to exclude various embodiments of the present disclosure.

An electronic device according to various embodiments of the present disclosure may, for example, include at least one of a smartphone, a tablet personal computer (PC), a mobile phone, a video phone, an electronic book (e-book) reader, a desktop PC, a laptop PC, a netbook computer, a workstation, a server, a personal digital assistant (PDA), a portable multimedia player (PMP), a moving picture experts group (MPEG-1 or MPEG-2) audio layer 3 (MP3) player, a mobile medical device, a camera, or a wearable device. According to various embodiments, the wearable device may include at least one of an accessory type (e.g., a watch, a ring, a wristlet, an anklet, a necklace, glasses, a contact lens, a head-mounted-device (HMD), or the like), a fabric or clothing integrated type (e.g., electronic clothes), a body mount type (e.g., a skin pad or tattoo), or a bio-implant type (e.g., an implantable circuit).

In various embodiments, the electronic device may be a home appliance. The home appliance may, for example, include at least one of a television (TV), a digital video disk (DVD) player, an audio system, a refrigerator, an air conditioner, a cleaner, an oven, a microwave, a washing machine, an air cleaner, a set-top box, a home automation control panel, a security control panel, a TV box (for example, Samsung HomeSync™, Apple TV™, or Google TV™), a game console (e.g., Xbox™ or PlayStation™), an electronic dictionary, an electronic locking system, a camcorder, or an electronic frame.

In another embodiment, the electronic device may include at least one of various medical devices (e.g., various portable medical measurement devices (i.e., a blood sugar measuring device, a heart rate measuring device, a blood pressure measurement device, a body temperature measurement device or the like), magnetic resonance angiography (MRA), magnetic resonance imaging (MRI), computerized tomography (CT), a photographing machine, an ultrasonic machine or the like), a navigation device, a global navigation satellite system (GNSS), an event data recorder (EDR), a flight data recorder (FDR), a car infotainment device, an electronic equipment for ship (e.g., a navigation device for ship, a gyrocompass, etc.), avionics, a security device, a head unit for car, an industrial or home robot, an automatic teller's machine (ATM) of a financial institution, a point of sales (POS) of a shop, or an internet of things (IoT) device (e.g., an electric bulb, various sensors, an electricity or gas meter, a sprinkler device, a fire alarm, a thermostat, a streetlight, a toaster, an exerciser, a hot water tank, a heater, a boiler, etc.).

According to various embodiments, the electronic device may include at least one of a part of furniture or building/structure, an electronic board, an electronic signature receiving device, a projector, or various metering devices (e.g., a tap water, electricity, gas, radio wave metering device or the like). In various embodiments, the electronic device may be one of the aforementioned various devices or a combination of more of them. The electronic device according to various embodiments may be a flexible electronic device. Also, the electronic device according to an embodiment of the present disclosure is not limited to the aforementioned devices, and may include a new electronic device based on the development of technology.

An electronic device according to various embodiments is described below with reference to the accompanying drawings. In the present disclosure, the term 'user' may denote a person who uses the electronic device or a device (e.g., an artificial-intelligence electronic device) which uses the electronic device.

Figure 2:
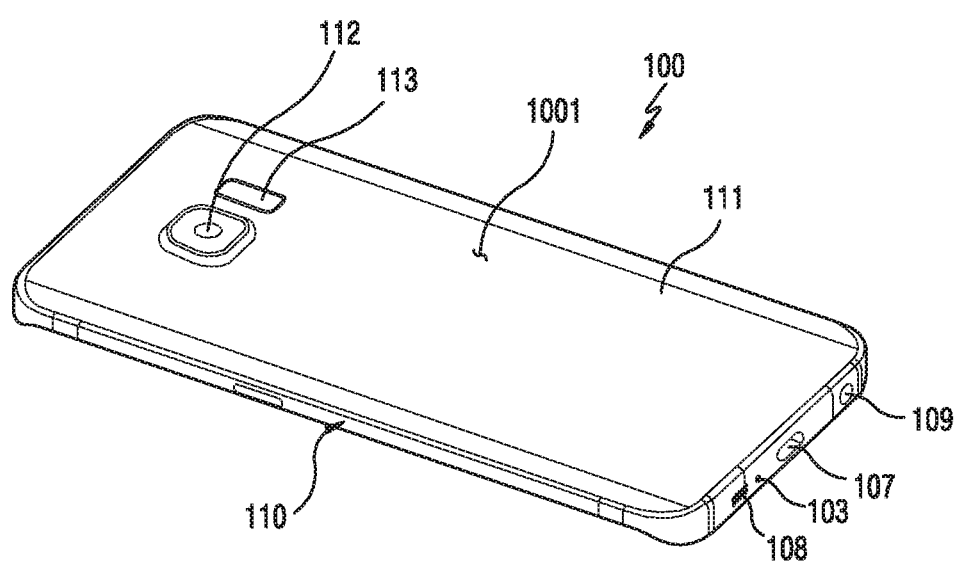
FIG. 2 is a rear perspective view of an electronic device according to various embodiments of the present disclosure.

FIG. 1 is a front perspective view of an electronic device according to various embodiments of the present disclosure. FIG. 2 is a rear perspective view of the electronic device according to various embodiments of the present disclosure.

Referring to FIGS. 1 and 2, the electronic device 100 may include a housing 110. According to an embodiment, the electronic device 100 may include a display 101 that is disposed in a second surface direction 1002 (e.g., a front surface direction) of the housing. According to an embodiment, the display 101 may include a touch sensor and thus operate as a touch screen device. According to an embodiment, the display 101 may include a pressure sensor and thus operate as a pressure reactive touch screen device as well. According to an embodiment, the electronic device 100 may include a receiver 102 that is disposed to output a counterpart's voice. According to an embodiment, the electronic device 100 may include a microphone 103 that is disposed to send a user's voice to a counterpart.

According to various embodiments, components for performing various functions of the electronic device 100 may be disposed around the receiver 102 that is installed in the electronic device 100. The components may include at least one sensor module 104. This sensor module 104 may, for example, include at least one sensor among an illumination sensor (e.g., a light sensor), a proximity sensor (e.g., a light sensor), an infrared sensor, an ultrasonic sensor, a fingerprint scan sensor, or an iris scan sensor. According to an embodiment, the component may include a first camera device 105. According to an embodiment, the component may include an indicator 106 (e.g., a light emitting diode (LED) device) for indicating state information of the electronic device 100 for a user.

According to various embodiments, the electronic device 100 may include a speaker 108 that is disposed at one side of the microphone 103. According to an embodiment, the electronic device 100 may include an interface connector port 107 that is disposed at the other side of the microphone 103, and performs a data transmission/reception function with an external device and receives external power to charge the electronic device 100. According to an embodiment, the electronic device 100 may include an ear jack hole 109 that is disposed at one side of the interface connector port 107.

According to various embodiments, the housing 110 may be formed with a conductive member and a non-conductive member. According to an embodiment, the housing 110 may be disposed along an edge of the electronic device 100. And, the housing 110 may be disposed in a scheme of extending up to a part of a first surface direction 1001 (e.g., a direction in which a first surface exists, i.e., a rear surface direction) of the electronic device 100 or at least a partial region of the second surface direction 1002 (e.g., a direction in which a second surface exits, i.e., a front surface direction) facing the first surface direction 1001. According to an embodiment, the housing 110 may be defined as at least a part of a thickness of the electronic device 100 along an edge of the electronic device 100, and may be formed in a closed loop shape. However, an embodiment is not limited to this, and the housing 110 may be formed in a scheme of contributing to the at least part of the thickness of the electronic device 100 as well. According to an embodiment, at least a part of the housing 110 may be embedded in the inside of the electronic device 100 as well.

According to various embodiments, the first surface direction 1001 may include a direction heading to the first surface, or a direction in which the first surface exists. According to various embodiments, the second surface direction 1002 may include a direction heading to the second surface, or a direction in which the second surface exists.

According to various embodiments, the electronic device 100 may include a cover 111 (e.g., a rear surface cover) that is disposed in the first surface direction 1001 (e.g., the rear surface direction) facing the second surface direction 1002. According to an embodiment, the electronic device 100 may include a second camera device 112 that is disposed through the cover 111. According to an embodiment, the electronic device 100 may include at least one electronic component 113 that is disposed at one side of the second camera device 112. According to an embodiment, the electronic component 113 may include at least one of an illumination sensor (e.g., a light sensor), a proximity sensor (e.g., a light sensor), an infrared sensor, an ultrasonic sensor, a heart rate sensor, a flash device or a fingerprint scan sensor.

According to various embodiments, the electronic device 100 may include a battery (not shown) (e.g., a rigid body type battery pack or a pouch type battery cell) that is fixed to the housing 110 in the inside of the electronic device 100 as a power supply means.

Figure 3:
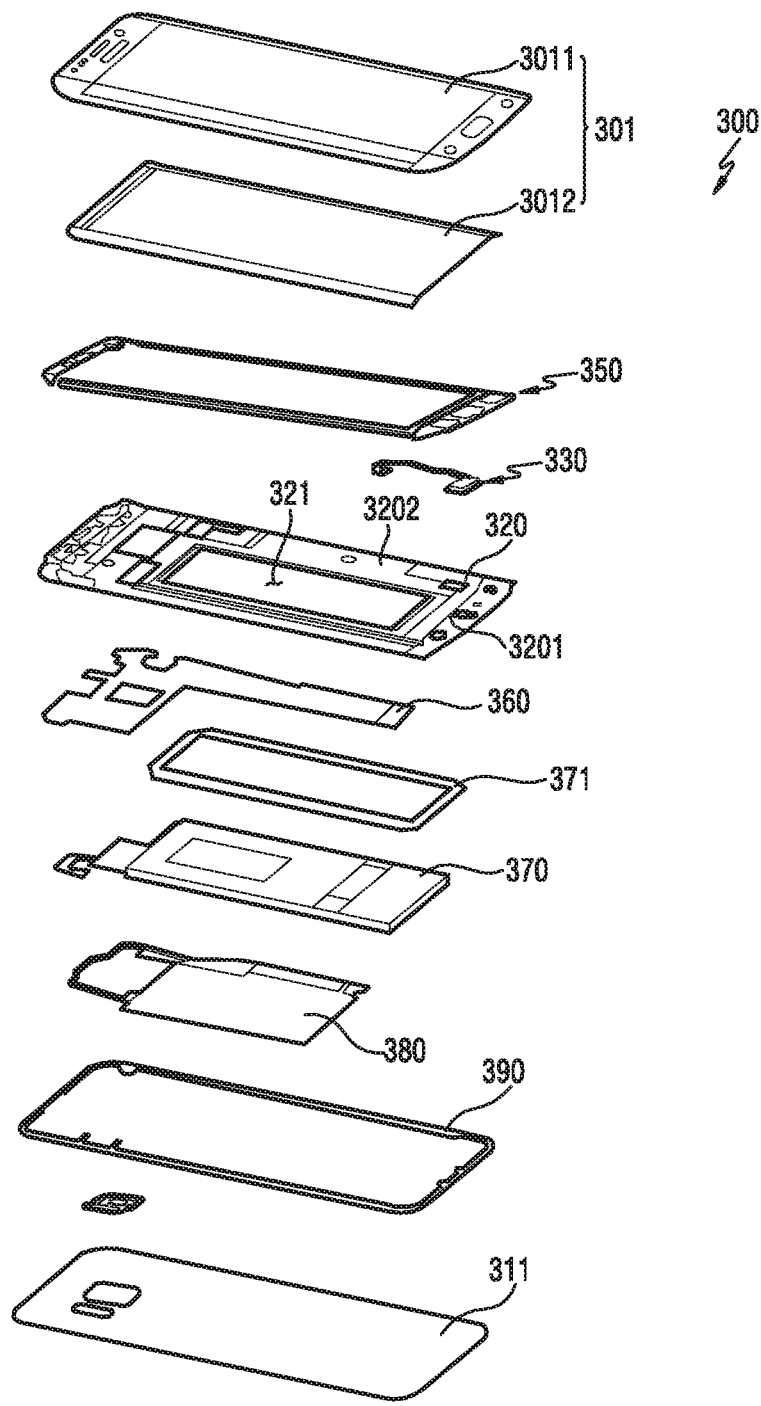
FIG. 3 is an exploded perspective view of an electronic device according to various embodiments of the present disclosure.

FIG. 3 is an exploded perspective view of an electronic device according to various embodiments of the present disclosure.

The electronic device 300 of FIG. 3 may be similar to the electronic device 100 of FIG. 1 and FIG. 2 or include other various embodiments of the electronic device.

Referring to FIG. 3, the electronic device 300 may include a housing 320. According to an embodiment, the housing 320 may include a first surface 3201, and a second surface 3202 facing the first surface 3201. According to an embodiment, the electronic device 300 may include a key input device 330, at least one seal member 350, and a display 301, which are disposed sequentially in a second surface 3202 direction of the housing 320. The display 301 includes a window 3011 and a display module 3012. According to an embodiment, a first surface direction may include a direction heading to the first surface 3201 or a direction in which the first surface 3201 exists. According to various embodiments, the second surface direction may include a direction heading to the second surface 3202 or a direction in which the second surface 3202 exists. According to an embodiment, the electronic device 300 may include a substrate 360 (e.g., a printed circuit board (PCB), a flexible printed circuit (FPC), a main board or the like), a battery 370, a wireless power transmission/reception member 380, a rear surface seal member 390 and a rear surface cover 311, which are disposed sequentially in the first surface 3201 direction of the housing 320. According to an embodiment, the battery 370 may be accepted in an acceptance cavity that includes a swelling hole 321 provided in the housing 320, and may be disposed avoiding the substrate 360. According to an embodiment, the battery 370 and the substrate 360 may be disposed in parallel with each other without mutual overlapping. However, an embodiment is not limited to this, and at least a partial region of the battery 370 may be disposed to overlap with the substrate 360 as well.

According to various embodiments, in an embodiment of the present disclosure, the plate type housing 320 is used single, but may be used together with at least one plate (e.g., a middle plate, a bracket, a rear plate, a separable battery cover or the like) coupled with the housing 320 as well. According to an embodiment, the housing 320 may be formed using both a conductive member (e.g., a metal member, etc.) and a non-conductive member (e.g., a resin, etc.). According to an embodiment, the housing 320 may be formed with the conductive member and the non-conductive member in an insert injection process or a double injection process.

According to various embodiments, the display 301 may be applied to the housing 320 after the display module 3012 is attached to a rear surface of the window 3011. According to an embodiment, the window 3011 may be formed of transparent materials such as a glass, a resin or the like. According to an embodiment, the display module 3012 may include a touch sensor. According to an embodiment, the display module 3012 may include a touch sensor and a pressure sensitive sensor (i.e., a force sensor) as well. According to an embodiment, the electronic device 300 may include at least one first seal member 350 that is interposed between the housing 320 and the display 301 for the purpose of waterproof.

According to various embodiments, the electronic device 300 may include at least one second seal member 390 that is interposed between the rear surface cover 311 of the housing 320 along its edge for the purpose of waterproof. According to an embodiment, the rear surface cover 311 may be formed of at least one material among a glass, a plastic, a compounded resin or a metal. According to an embodiment, the first seal member 350 and the second seal member 390 may include at least one of a tape, an adhesive agent, a waterproof dispenser, silicon, a waterproof rubber, or urethane.

According to various embodiments, the substrate 360 may include a memory, a processor, various sensors, an input/output terminal, etc., and perform various functions of the electronic device 300 by using power supplied from the battery 370. According to an embodiment, the substrate 360 may be disposed adjacent with the battery 370. According to an embodiment, the substrate 360 may be disposed in such a manner that one surface of the substrate 360 is in contact with one surface of the battery 370 and thus at least a part of the substrate 360 is overlapped with the battery 370. Or, the substrate 360 may be disposed in a manner of being configured in a '¬' or '⊏' shape avoiding a disposition space of the battery 370, to divide and occupy the same plane with the battery 370.

According to various embodiments, the battery 370 may supply power to the main components such as the display 301, the substrate 360, etc., and provide a safe mounting plane for the wireless power transmission and/or reception member 380, various sheet type sensors, or the like. The battery 370 may be disposed in a safe mounting cavity that is prepared in a partial region of the housing 320 or in a battery pack mounting region that has a constant cavity secured by a support rib, etc., for the sake of stable assembly and in-use flowage prevention based on a volume and weight. According to an embodiment, the battery 370 may be used as a built-in battery pack that is embedded in the electronic device 300.

According to various embodiments, the battery 370 may be attached and fixed within a battery acceptance cavity of the housing 320 by means of at least one adhesive member 371. According to an embodiment, the adhesive member 371 may use materials of excellent adhesiveness performance and impact resistance. According to an embodiment, the adhesive member 371 may include a functional adhesive member that is interposed between the housing 320 and the battery 370 and is decreased in its adhesiveness area if a tension works in a shear direction vertical with a battery mounting direction.

According to various embodiments, the housing 320 may have a separation structure for leading easy separation when the battery 370 is to be separated from the housing 320 for the sake of maintenance. According to an embodiment, the housing 320 may include a structure for easily inputting a solvent (e.g., a stripper) for decreasing a physical property of adhesiveness of the adhesive member 371, and easily diffusing the inputted solvent into an adhesive region.

A structure of the housing and a structure for solvent input and diffusion are described below in detail.

Figure 4A:
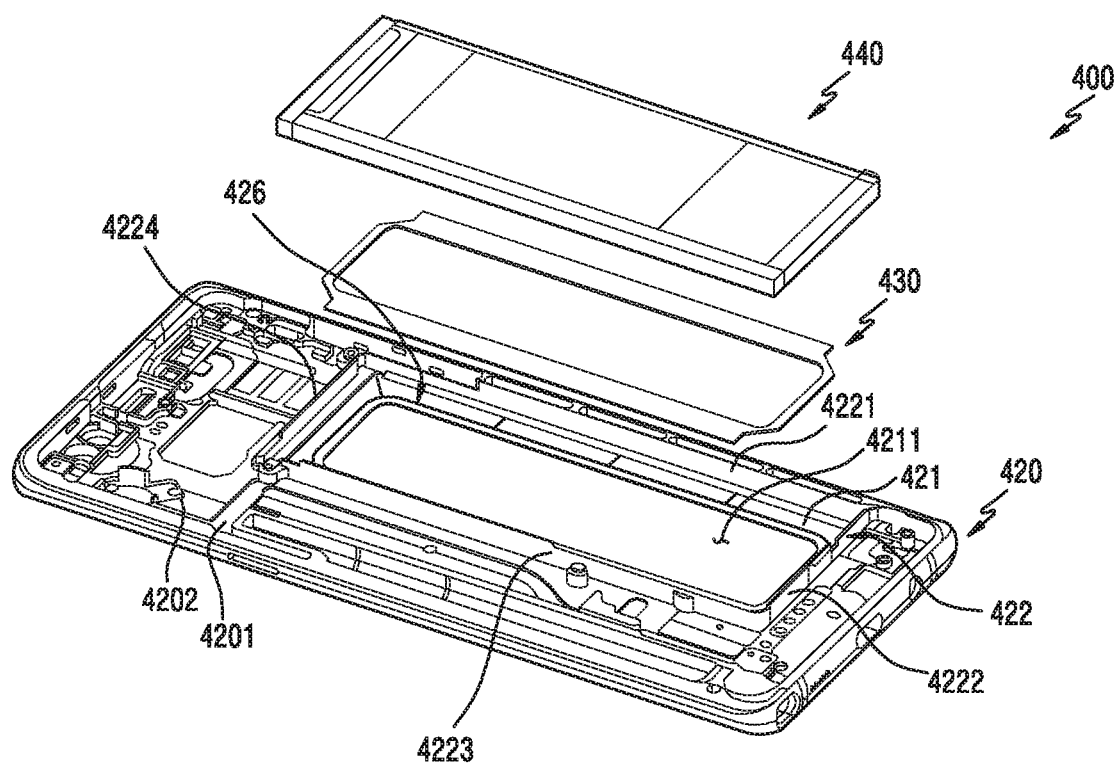
FIG. 4A is an exploded perspective view illustrating a housing of an electronic device to which a battery is applied according to various embodiments of the present disclosure.
Figure 4B:
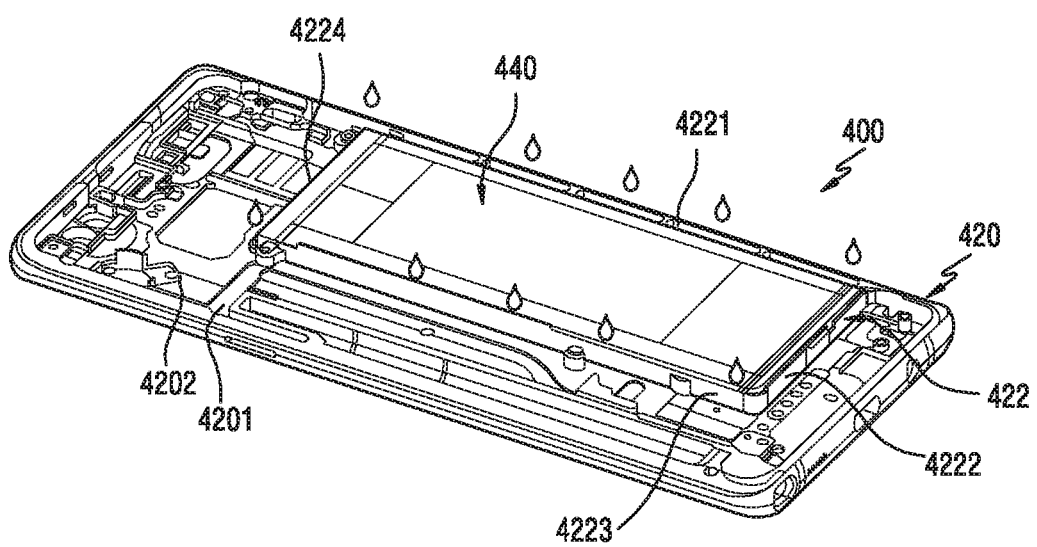
FIG. 4B is a perspective view illustrating a state in which a battery is coupled to a housing according to various embodiments of the present disclosure.

FIG. 4A is an exploded perspective view illustrating a housing of an electronic device to which a battery is applied according to various embodiments of the present disclosure. FIG. 4B is a perspective view illustrating a state in which the battery is coupled to the housing according to various embodiments of the present disclosure.

The electronic device 400 of FIGS. 4A and 4B may be similar to the electronic device 100 of FIGS. 1 and 2 or the electronic device 320 of FIG. 3, or include other various embodiments of the electronic device.

Referring to FIGS. 4A and 4B, the electronic device 400 may include a housing 420 (e.g., the housing 320 of FIG. 3). According to an embodiment, the housing 420 may include a first surface 4201 (e.g., the first surface 3201 of FIG. 3), and a second surface 4202 (e.g., the second surface 3202 of FIG. 3) facing the first surface 4201. According to an embodiment, the electronic device 400 may include a battery 440 that is disposed in a battery mounting portion 421 formed in the first surface 4201 of the housing 420, and an adhesive member 430 that attaches and fixes the battery 440 to the battery mounting portion 421.

According to various embodiments, the housing 420 may be formed with a conductive member and a non-conductive member. According to an embodiment, when the housing 420 is to be formed with the conductive member and the non-conductive member, the housing 420 may be formed by a double injection process, an insert injection process or a computer numerical control (CNC) process. According to an embodiment, the housing 420 may include the battery mounting portion 421 for accepting the battery 440 that is formed in the first surface 4201. According to an embodiment, the battery mounting portion 421 may be formed substantially to have a structure capable of safely mounting the battery 440. According to an embodiment, the battery mounting portion 421 may be defined by a support rib 422 extended a constant height in an outside direction from the first surface 4201 of the housing 420. According to an embodiment, the support rib 422 may include a first support rib 4221 that is extended in a first direction and has a first length, a second support rib 4222 that is extended in a second direction perpendicular to the first direction and has a second length longer than the first length, a third support rib 4223 that is extended substantially in parallel with the first support rib 4221 and has the first length, and a fourth support rib 4224 that is extended in parallel with the second support rib 4222 and has the second length. According to an embodiment, the battery mounting portion 421 may include a swelling hole 4211 that has a constant area and is capable of accepting a swelling phenomenon of the battery 440 (i.e., a phenomenon of swelling in a partial region (substantially a center portion) of the battery). According to an embodiment, the support rib 422 defines the battery mounting portion 421 by a shape for accepting the rectangular battery 440, but the support rib 422 is changeable in various schemes by a shape of the battery 440 applied. According to an embodiment, a height of the support rib 422 may be formed to be the same as a thickness of the battery 440 or be lower than the thickness of the battery 440 or be higher than the thickness of the battery 440. According to an embodiment, the support rib 422 may prevent a flowage of the battery 440 that is safely mounted in the battery mounting portion 421, and give a help for reinforcing the rigidity of the electronic device 400.

According to various embodiments, the adhesive member 430 may be disposed between the battery mounting portion 421 and the battery 440. According to an embodiment, the adhesive member 430 may include a functional adhesive member that, if a tension works in a shear direction vertical with a battery mounting direction, is decreased in its adhesive area and is decreased in its adhesiveness physical property.

According to various embodiments, the battery mounting portion 421 may include a recess 426 that is provided lower than the battery mounting portion 421. According to an embodiment, the recess 426 may be distributed uniformly in an overall region of the battery mounting portion 421, and may have a mutually connected structure. According to an embodiment, as in FIG. 4B, an adhesive member separating solvent (e.g., a stripper) may be coated on at least a part of the housing 420 with a view to separating the battery 440 safely mounted in the battery mounting portion 421 for the sake of maintenance. According to an embodiment, the adhesive member separating solvent may include alcohol. According to an embodiment, the adhesive member separating solvent may employ materials which are harmless to the environment and, though actually getting in contact with other components, do not damage the corresponding components, and in which a composition applied does not remain or elimination is easy for recycle.

According to various embodiments, as moving along the recess 426 disposed in the battery mounting portion 421, the coated solvent may get in uniform contact with the adhesive member 430 and then be diffused into a periphery. According to an embodiment, the recess 426 (e.g., a recess 523 of FIG. 5) may be disposed uniformly in an overall region of the battery mounting portion 421, and may be provided in various shapes according to a size and shape of the battery mounting portion 421.

Figure 5:
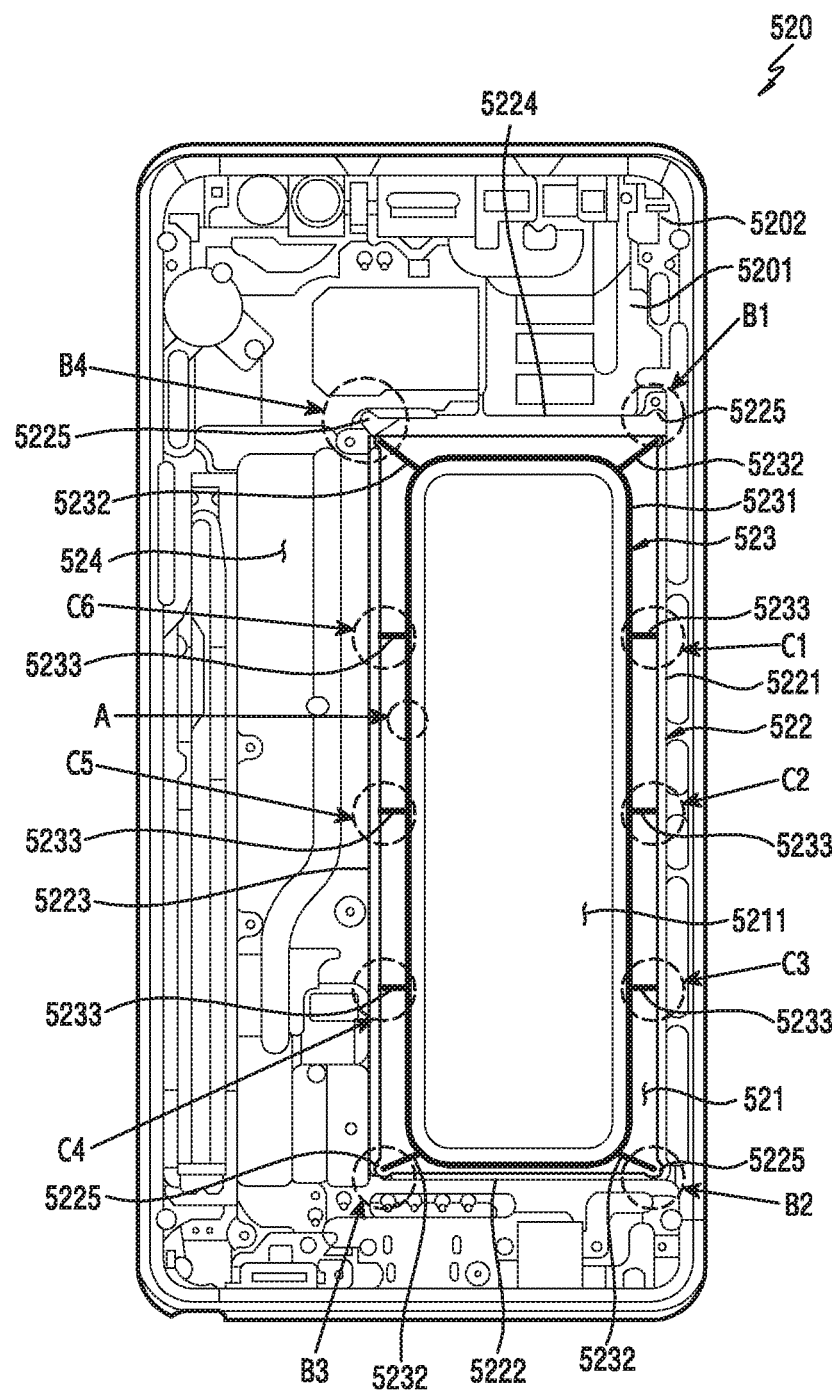
FIG. 5 is a plan view illustrating a construction of a housing according to various embodiments of the present disclosure.

FIG. 5 is a plan view illustrating a construction of a housing according to various embodiments of the present disclosure.

The housing 520 of FIG. 5 may be similar to the housing 110 of FIG. 1, the housing 320 of FIG. 3 or the housing 420 of FIG. 4, or include other various embodiments of the housing.

Referring of FIG. 5, the housing 520 (e.g., the housing 320 of FIG. 3) may include a first surface 5201 (e.g., the first surface 3201 of FIG. 3), and a second surface 5202 (e.g., the second surface 3202 of FIG. 3) facing the first surface 5201. According to an embodiment, the housing 520 may include a battery mounting portion 521 (e.g., the battery mounting portion 421 of FIG. 4A) for accepting a battery (e.g., the battery 440 of FIG. 4A) in the first surface 5201. According to an embodiment, the battery mounting portion 521 may be formed substantially to have a structure capable of safely mounting the battery. According to an embodiment, the battery mounting portion 521 may be defined by a support rib 522 extended a constant height in an outside direction from the first surface 5201 of the housing 520. According to an embodiment, the support rib 522 may include a first support rib 5221 that is extended in a first direction and has a first length, a second support rib 5222 that is extended in a second direction perpendicular to the first direction and has a second length longer than the first length, a third support rib 5223 that is extended substantially in parallel with the first support rib 5221 and has the first length, and a fourth support rib 5224 that is extended in parallel with the second support rib 5222 and has the second length. According to an embodiment, the battery mounting portion 521 may include a swelling hole 5211 that has a constant opening area and is capable of accepting a swelling phenomenon of the battery.

According to various embodiments, the battery mounting portion 521 may include a recess 523 that is provided lower than a safe mounting surface and has a constant depth and width. According to an embodiment, the recess 523 may be provided to be distributed uniformly in a substantially overall region of the battery mounting portion 521, and may have a mutually connected shape. According to an embodiment, the recess 523 may be shaped together when the housing 520 is formed, and may be provided in the form of a groove through surface treatment such as laser processing, etching, hairline processing, etc. So, the recess 523 may be provided to have a relatively small width (e.g., about 0.3 mm or less). According to an embodiment, a width or depth of the recess 523 may be formed regular or irregular. According to an embodiment, the battery mounting portion 521 may maintain a state of being isolated from a peripheral substrate mounting part 524 by the support rib 522 formed in a closed loop scheme.

According to various embodiments, the housing 520 may include at least one solvent input region (B1, B2, B3, B4, C1, C2, C3, C4, C5 or C6) for easily inputting a solvent and effectively diffusing the solvent via the recess 523 after the battery is safely mounted in the battery mounting portion 521. According to an embodiment, the solvent input region (B1, B2, B3, B4, C1, C2, C3, C4, C5 or C6) may be connected with the recess 523 by a structural shape, and may be disposed at a regular or irregular interval along the support rib 522. According to an embodiment, the solvent input region (B1, B2, B3 or B4) may be disposed in each corner region of the support rib 522. According to an embodiment, the solvent input region (C1, C2, C3, C4, C5 or C6) may be disposed at a regular interval or irregular interval in at least one location of each rib 5221, 5222, 5223 or 5224 as well. According to an embodiment, each corner region may have a solvent input slot 5225 that is exposed even after the battery is mounted in the battery mounting portion 521, and the corresponding region (C1, C2, C3, C4, C5 or C6) of each rib may also have a structure capable of easily diffusing the inputted solvent into the recess 523.

According to various embodiments, a region for solvent input may be disposed in such a manner that, besides the aforementioned region (e.g., the C1, C2, C3, C4, C5 or C6 region) of the support rib 522, at least one region is extended along the recess 523 through a rib wall surface and is finally exposed to the external as well. According to an embodiment, the corresponding region (C1, C2, C3, C4, C5 or C6) of the rib that is applied as the corresponding solvent input region may include a solvent input slot that is provided in the same or similar scheme to the aforementioned solvent input slot in order to easily forward a solvent to the recess 523 along the rib wall surface as well.

According to various embodiments, the recess 523 may include at least one diffusion path 5231 that has a closed loop shape in the battery mounting portion 521, and at least one input path 5232 or 5233 that is connected from the solvent input region (B1, B2, B3, B4, C1, C2, C3, C4, C5 or C6) to the diffusion path 5231. According to an embodiment, each path 5231, 5232 or 5233 may be provided in various shapes, and each input path 5232 or 5233 may be provided to be connected mutually through the diffusion path 5231.

FIGS. 6A through 6D are main portion perspective views illustrating various section shapes of a recess of a region A of FIG. 5 according to various embodiments of the present disclosure. According to an embodiment, the region A of FIG. 5 represents a diffusion path (e.g., the diffusion path 5231 of FIG. 5) of the recess (e.g., the recess 523 of FIG. 5), but besides the diffusion path, an input path (e.g., the input path 5232 or 5233 of FIG. 5) of the recess may be also provided in the same scheme.

Figure 6A:
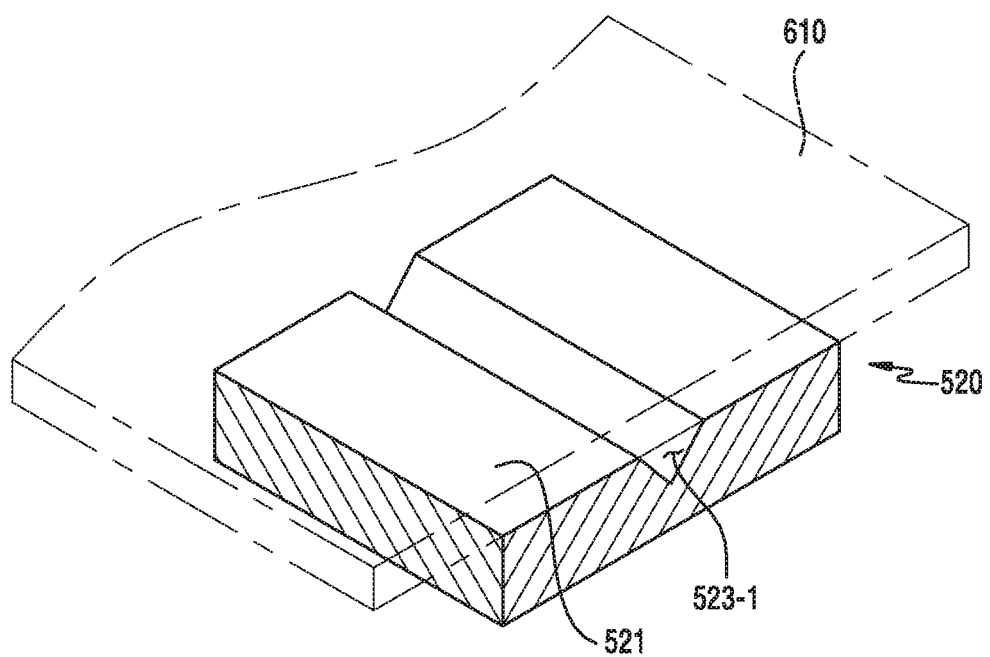
FIGS. 6A, 6B, 6C, and 6D are main portion perspective views illustrating various section shapes of a recess of a region A of FIG. 5 according to various embodiments of the present disclosure.

Referring to FIG. 6A, the housing 520 (e.g., the housing 320 of FIG. 3) may include the battery mounting portion 521 in which a battery is attached by an adhesive member 610. According to an embodiment, the battery mounting portion 521 may include a recess 523-1 which has a constant width and is provided in an inverted triangle shape of which the ending portion is sharp at a constant depth.

Figure 6B:
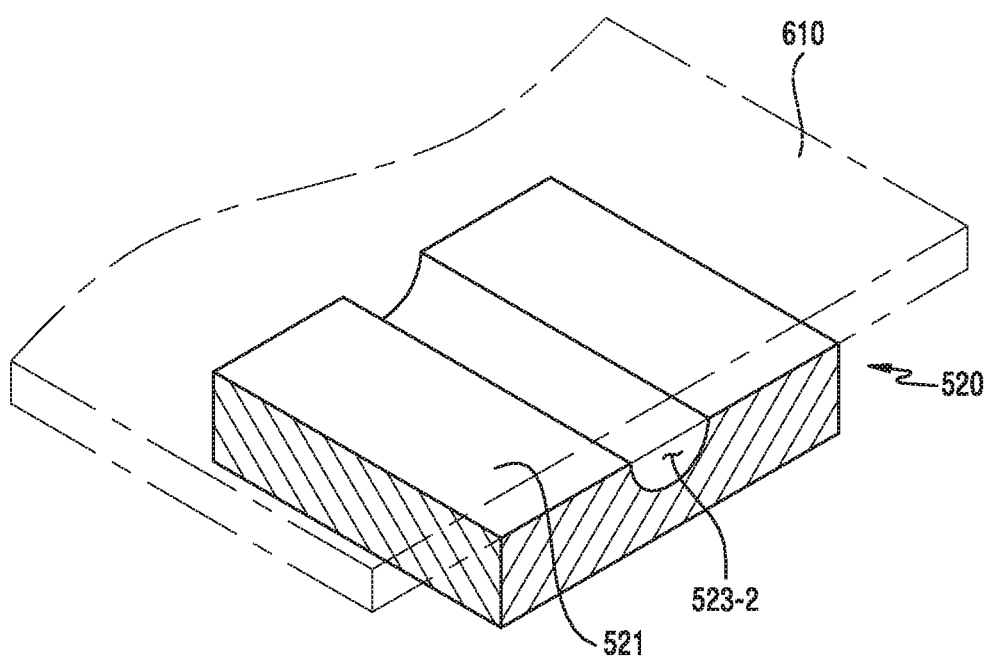

Referring to FIG. 6B, the housing 520 may include the battery mounting portion 521. According to an embodiment, the battery mounting portion 521 may include a recess 523-2 which has a constant width and is provided in a curved shape of which the ending portion is curved at a constant depth as well.

Figure 6C:
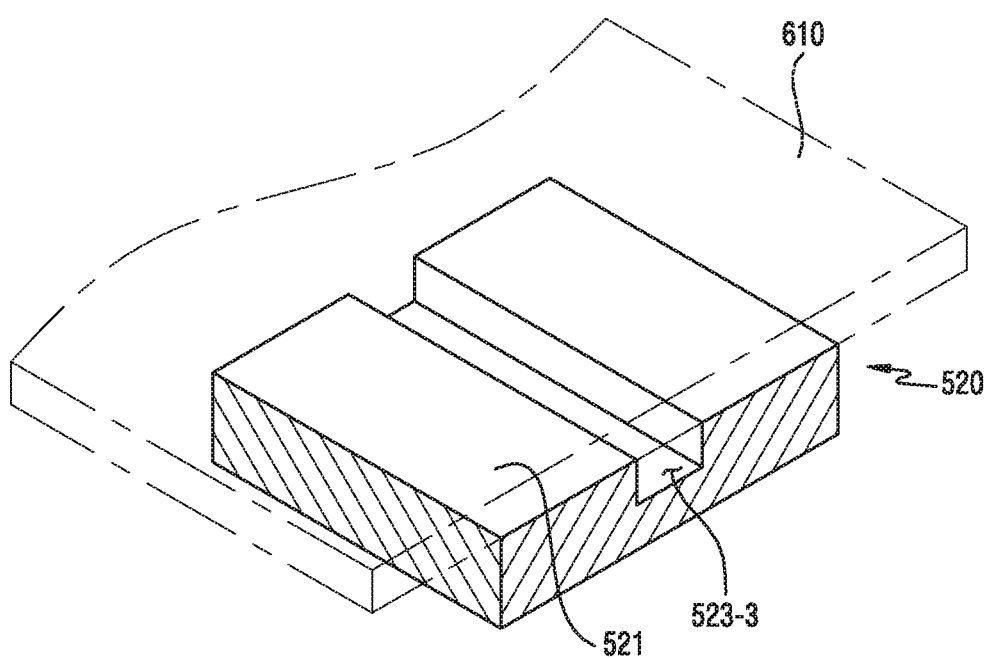

Referring to FIG. 6C, the housing 520 may include the battery mounting portion 521. According to an embodiment, the battery mounting portion 521 may include a recess 523-3 which has a constant width and is provided to have a four-corner section shape at a constant depth as well. According to an embodiment, the recess 523-3 may be provided in a scheme in which a width of the four-corner section shape is gradually decreased or increased over the length of the recess 523-3.

Figure 6D:
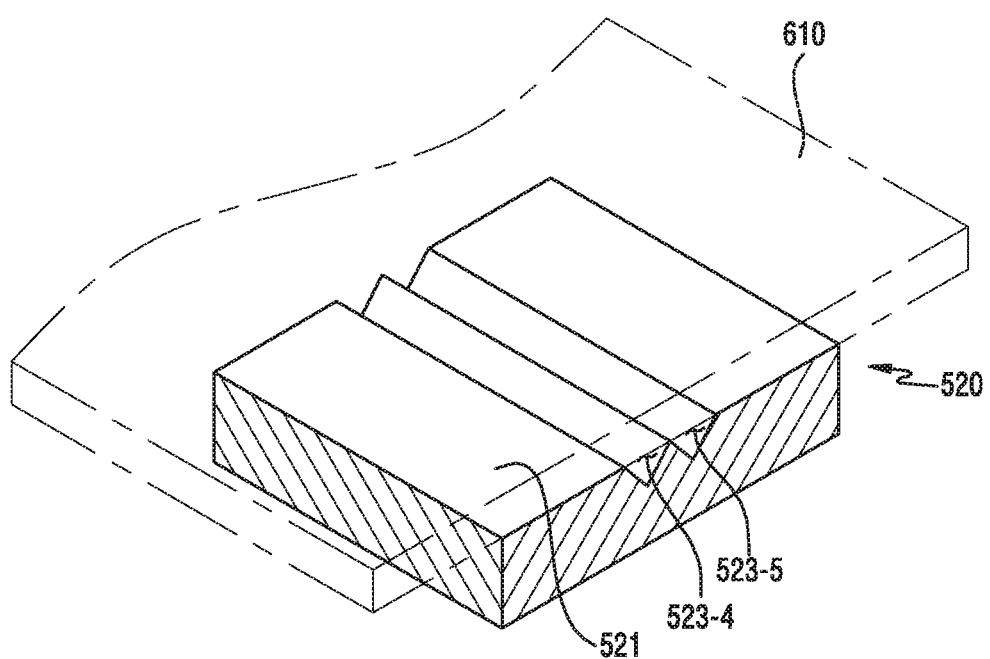

Referring to FIG. 6D, the housing 520 may include the battery mounting portion 521. According to an embodiment, the battery mounting portion 521 may include a pair of recesses 523-4 and 523-5 which have a constant width and are provided continuously at a constant depth as well. According to an embodiment, the battery mounting portion 521 may include three or more recesses provided continuously as well. A section shape of each recess 523-4 or 523-5 is similar with the shape of the recess 523-1 of FIG. 6A, but an embodiment is not limited to this. For instance, the section shape of each recess 523-4 or 523-5 may be replaced with a section shape of the recess 523-2 or 523-3 illustrated in FIG. 6B or FIG. 6C or other various shapes as well.

According to various embodiments, the recess may be provided to have a pattern (e.g., a corrosion pattern, etc.) that has a different surface roughness (e.g., a coarseness degree) from a periphery of the battery mounting portion as well.

Figure 7A:
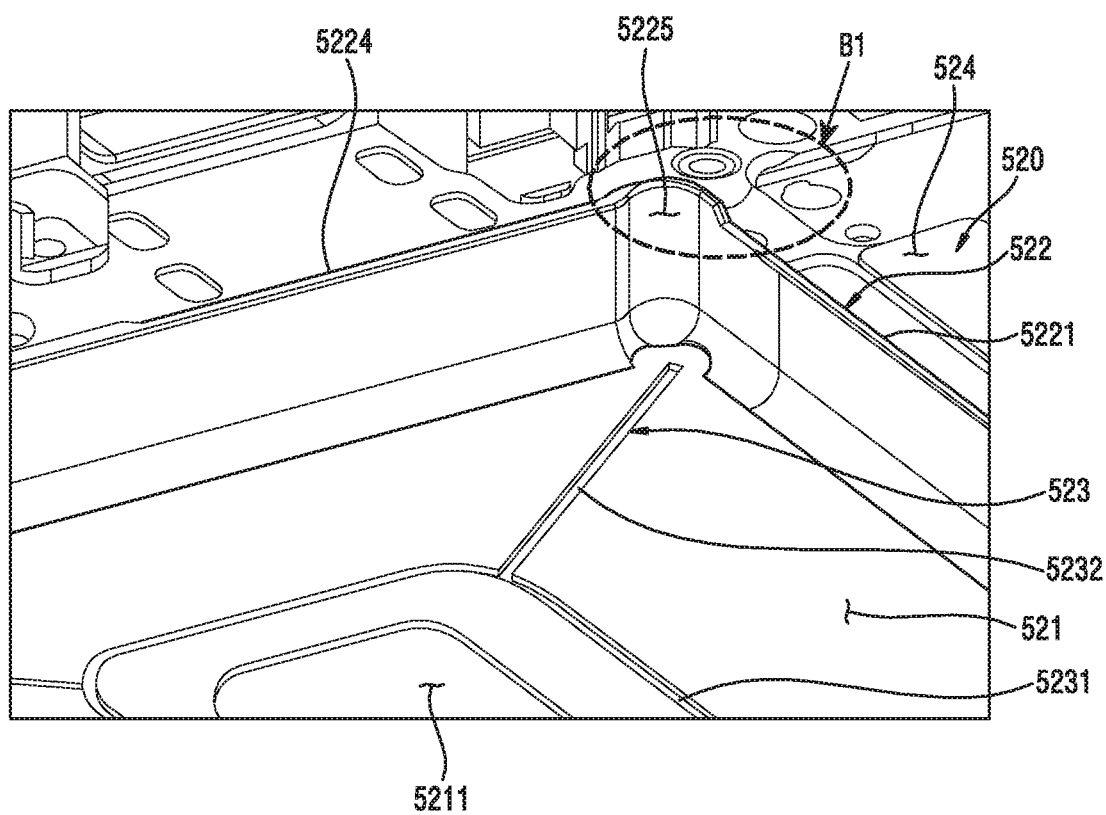
FIGS. 7A and 7B are diagrams illustrating a construction of a solvent input slot of a region B1 of FIG. 5 according to various embodiments of the present disclosure.
Figure 7B:
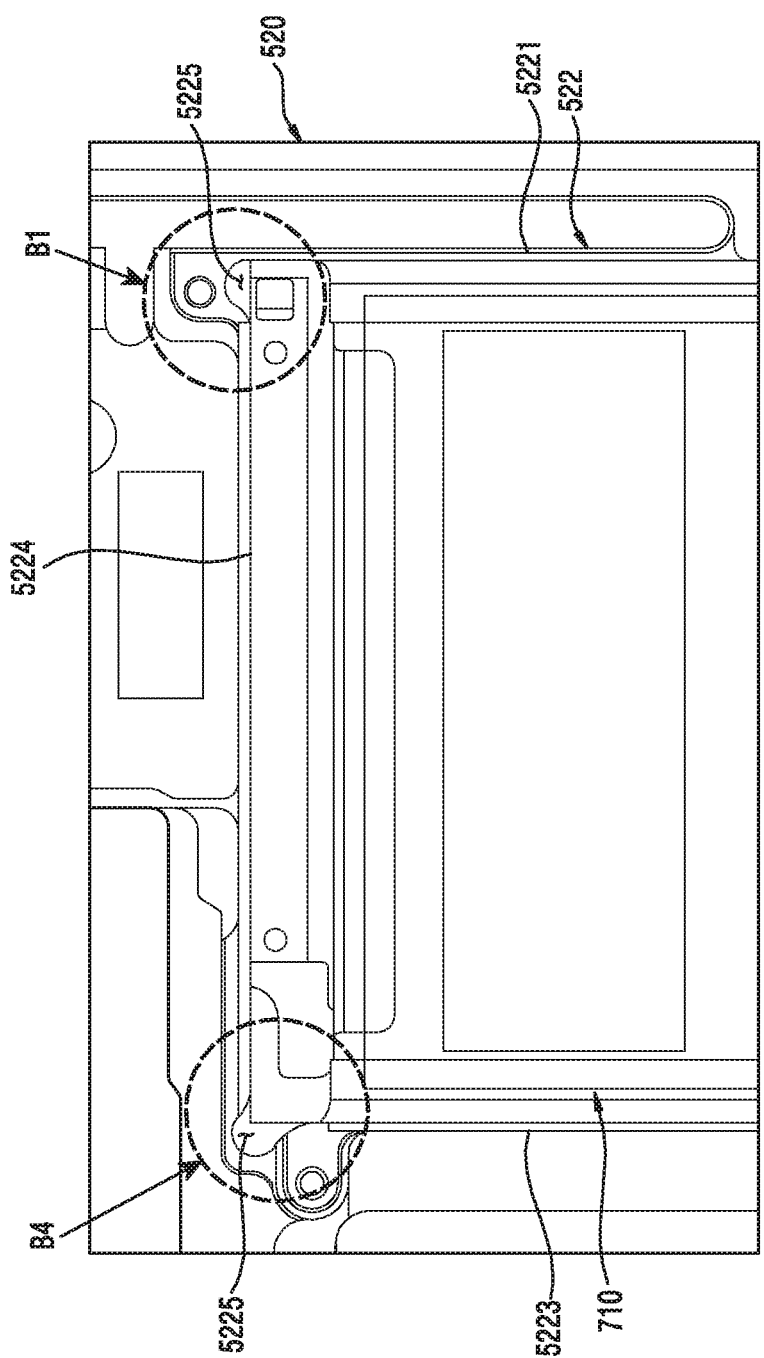

FIGS. 7A and 7B are diagrams illustrating a construction of a solvent input slot of the region B1 of FIG. 5 according to various embodiments of the present disclosure. According to an embodiment, the region B2, B3 or B4 of FIG. 5 may be formed to have the same shape as the region B1, too.

Referring to FIG. 7A, the solvent input slot 5225 may be provided in the support rib 522 of the housing 520 that defines the battery mounting portion 521. According to an embodiment, the solvent input slot 5225 may be provided in a scheme of being protruded outside at a corner portion where the first support rib 5221 and the fourth support rib 5224 meet with each other. But, an embodiment is not limited to this, and the solvent input slot 5225 may be provided in at least one rib among the first support rib 5221, the second support rib 5222, the third support rib 5223 or the fourth support rib 5224 as well. According to an embodiment, the solvent input slot 5225 may be provided in a funnel shape that is increased in its width over the length of the solvent input slot 5225. According to an embodiment, the solvent input slot 5225 may be provided to be connected with the solvent input path 5232 of the recess 523 that is provided in the battery mounting portion 521.

Referring to FIG. 7B, if a battery 710 is safely mounted in and fixed to the battery mounting portion 521 by a predetermined adhesive member, the solvent input slot 5225 may be exposed to a location extended from the support rib 522. According to an embodiment, when a worker is to separate the battery 710 from the housing 520 for the sake of maintenance, the worker inputs a solvent through the solvent input slot 5225. If so, the inputted solvent is diffused into a recess (e.g., the recess 523 of FIG. 5) through the solvent input slot 5225, thereby being capable of weakening an adhesive strength of the adhesive member.

Figure 8A:
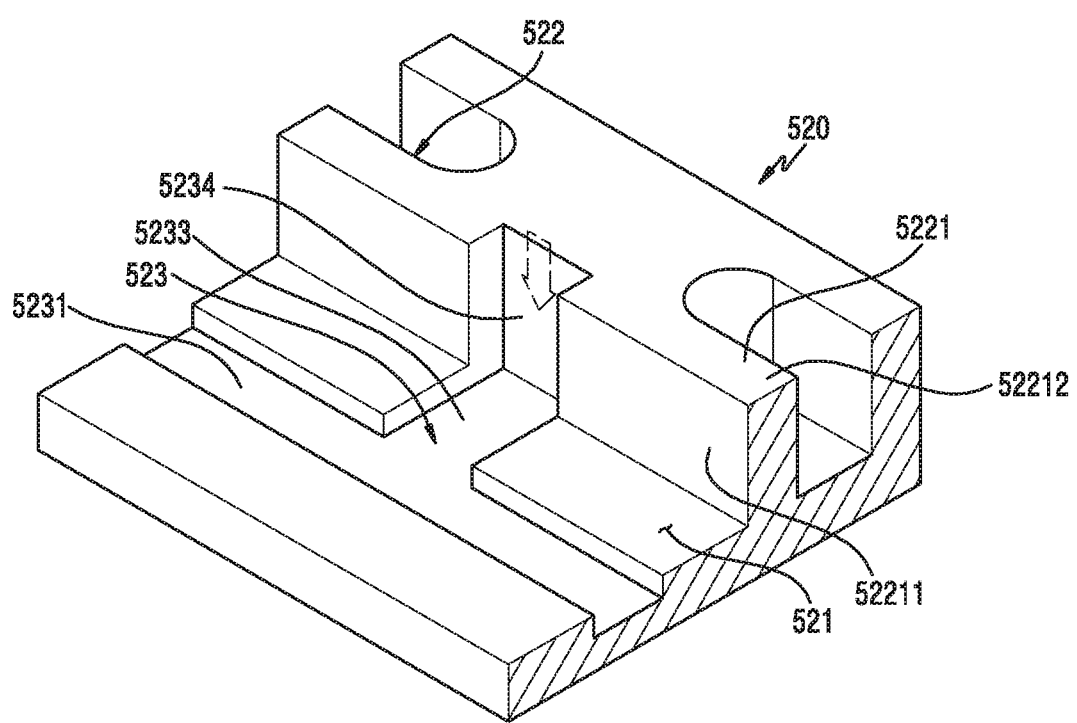
FIGS. 8A, 8B, and 8C are main portion perspective views illustrating various shapes of a recess of a region C1 of FIG. 5 according to various embodiments of the present disclosure.
Figure 8B:
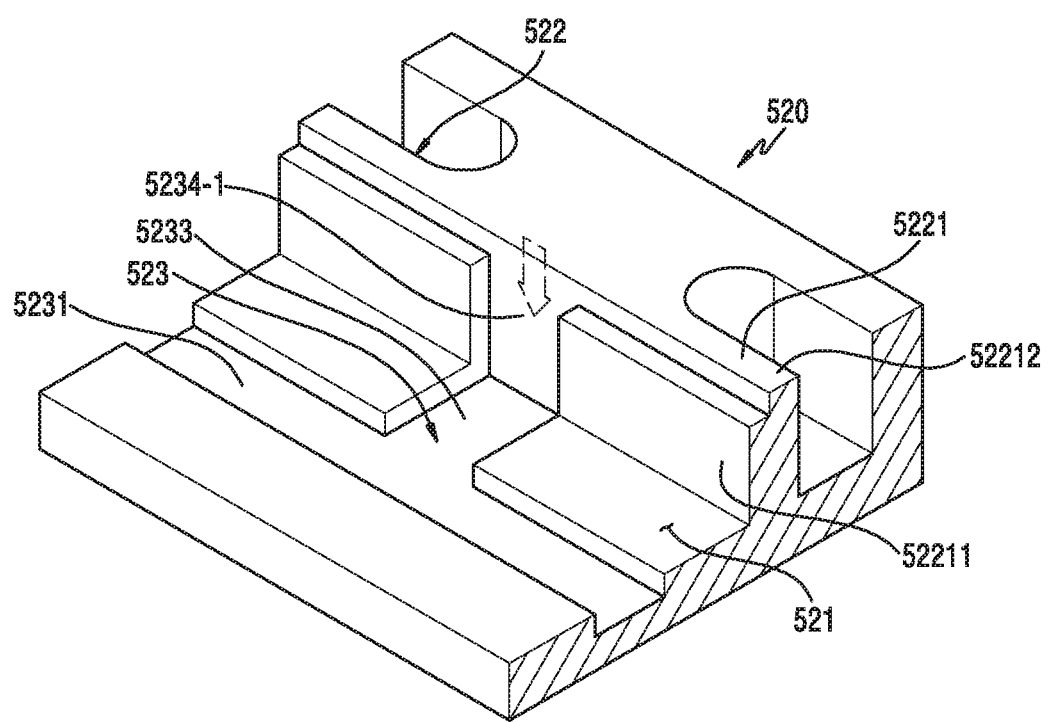
Figure 8C:
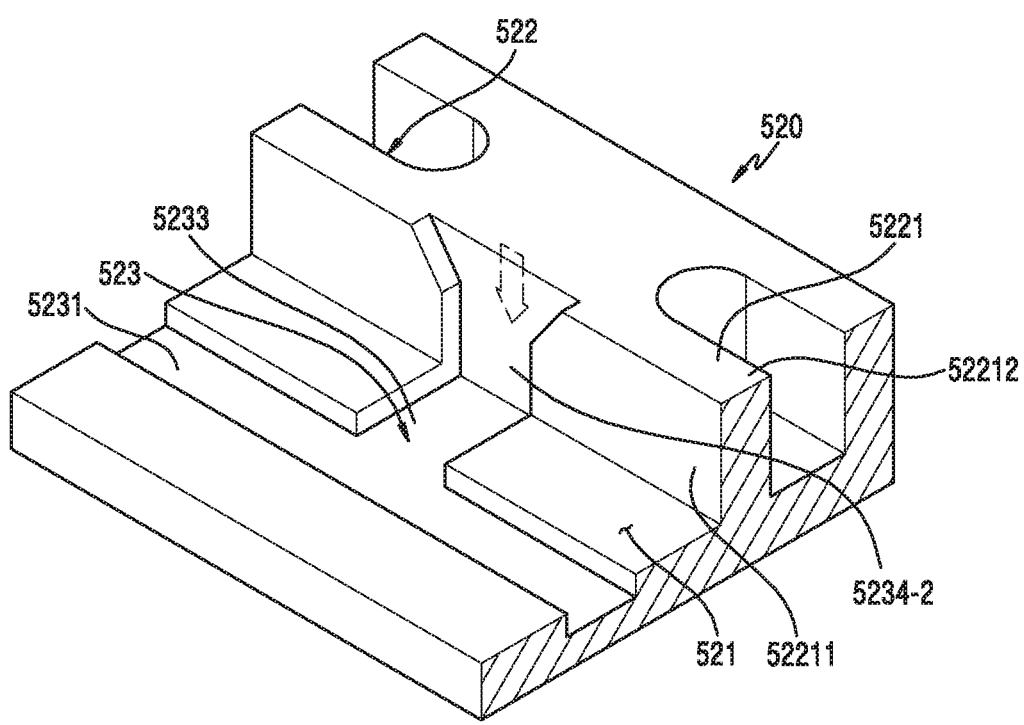

FIGS. 8A through 8C are main portion perspective views illustrating various shapes of a recess of the region C1 of FIG. 5 according to various embodiments of the present disclosure. According to an embodiment, the region C2, C3, C4, C5 or C6 of FIG. 5 may be formed to have the same shape as the region C1, too.

Referring to FIGS. 8A through 8C, the battery mounting portion 521 of the housing 520 may include the recess 523 that is provided to overall diffuse, into an adhesive region, an adhesive member separating solvent inputted from the external. According to an embodiment, the recess 523 may include the diffusion path 5231 that is provided in the battery mounting portion 521, the first input path 5233 that is connected with the diffusion path 5231 and is extended up to the first support rib 5221, and the second input path 5234 that is connected with the first input path 5233 and is extended up to a top surface 52212 along an inner wall 52211 of the first support rib 5221. In this case, although the battery is mounted in a scheme of getting in tight contact with the inner wall 52211 of the first support rib 5221, the solvent may be inputted via the second input path 5234 provided in the top surface 52212 of the first support rib 5221, and may be easily diffused riding the first input path 5233 and the diffusion path 5231.

According to various embodiments, as illustrated in FIG. 8B, a second input path 5234-1 that extends from the first input path 5233 of the recess 523 to the inner wall 52211 of the first support rib 5221 may be provided in a 'T' shape. According to an embodiment, as illustrated in FIG. 8C, a second input path 5234-2 may be provided in a funnel shape of which the upper part is widened. In this case, by the 'T' shape of the second input path 5234-1 illustrated in FIG. 8B or the funnel shape of the second input path 5234-2 illustrated in FIG. 8C, the inputted solvent may be guided in the direction of the first input path 5233 without overflowing outside the first support rib 5221.

Figure 9:
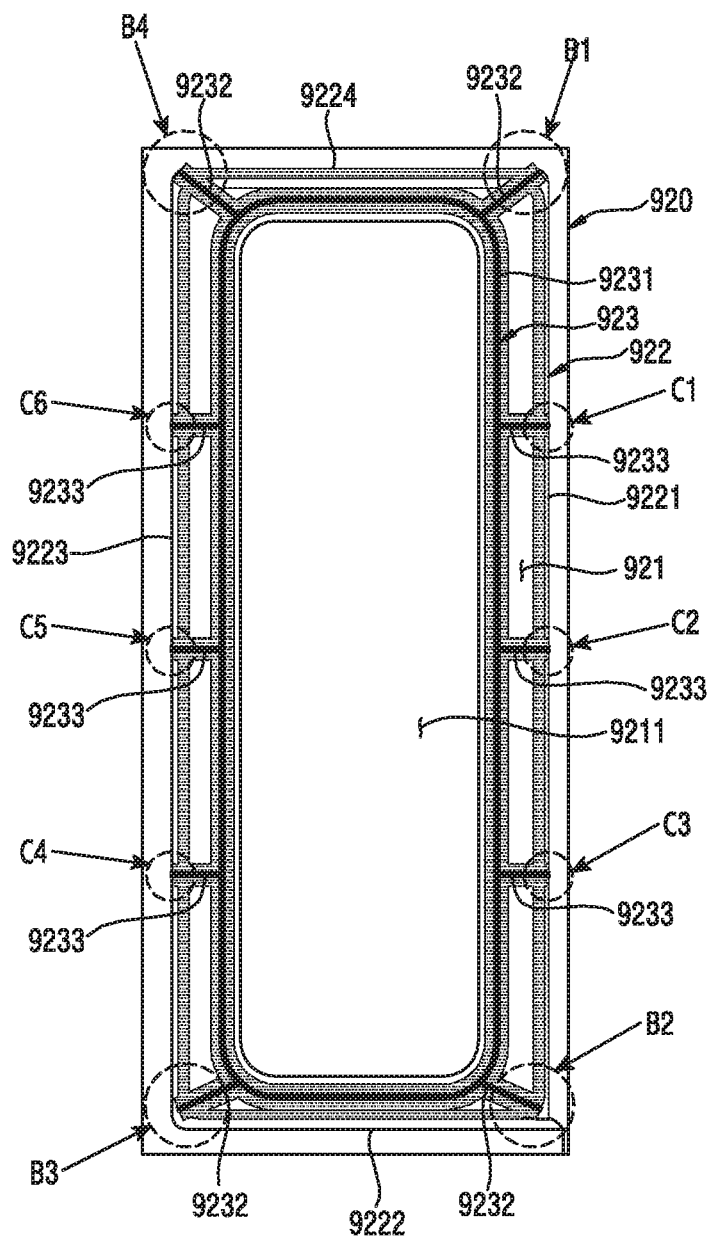
FIG. 9 is a diagram illustrating a state in which a solvent inputted to a housing is diffused according to various embodiments of the present disclosure.

FIG. 9 is a diagram illustrating a state in which a solvent inputted to a housing is diffused according to various embodiments of the present disclosure.

The housing 920 of FIG. 9 may be similar to the housing 110 of FIG. 1, the housing 320 of FIG. 3, the housing 420 of FIG. 4 or the housing 520 of FIG. 5, or include other various embodiments of the housing.

Referring to FIG. 9, the housing 920 may include a battery mounting portion 921 for accepting a battery (e.g., the battery 440 of FIG. 4A). According to an embodiment, the battery mounting portion 921 may be defined by a support rib 922 that is extended a constant height upward from the housing 920. According to an embodiment, the support rib 922 may include a first support rib 9221 that is extended in a first direction and has a first length, a second support rib 9222 that is extended in a second direction perpendicular to the first direction and has a second length longer than the first length, a third support rib 9223 that is extended substantially in parallel with the first support rib 9223 and has the first length, and a fourth support rib 9224 that is extended in parallel with the second support rib 9222 and has the second length. According to an embodiment, the battery mounting portion 521 may include a swelling hole 9211 that has a constant area and is capable of accepting a swelling phenomenon of the battery.

According to various embodiments, the battery mounting portion 921 may include a recess 923 that is provided lower than a safe mounting surface and has a constant depth and width. According to an embodiment, the recess 923 may be provided to be distributed uniformly in a substantially overall region of the battery mounting portion 921, and may have a mutually connected shape. According to an embodiment, the battery mounting portion 921 may maintain a state of being isolated from a peripheral region by the support rib 922 that is formed in a closed loop scheme.

According to various embodiments, the housing 920 may include at least one solvent input region (B1, B2, B3, B4, C1, C2, C3, C4, C5 or C6) for easily inputting a solvent and effectively diffusing the solvent via the recess 923 after the battery is safely mounted in the battery mounting portion 921. According to an embodiment, the solvent input region (B1, B2, B3, B4, C1, C2, C3, C4, C5 or C6) may be connected with the recess 923 by a structural shape, and may be disposed at a regular or irregular interval along the support rib 922. According to an embodiment, the at least one solvent input region (B1, B2, B3, B4, C1, C2, C3, C4, C5 or C6) may be configured similar to the aforementioned solvent input structures of FIG. 6A to FIG. 8C.

According to various embodiments, the solvent input region (B1, B2, B3 or B4) may be disposed in each corner region of the support rib 922. According to an embodiment, the solvent input region (C1, C2, C3, C4, C5 or C6) may be disposed at a regular interval or irregular interval in at least one location of each rib 9221, 9222, 9223 or 9224 as well.

According to various embodiments, the recess 923 may include at least one diffusion path 9231 that has a closed loop shape in the battery mounting portion 921, and at least one input path 9232 or 9233 that is connected from the solvent input region (B1, B2, B3, B4, C1, C2, C3, C4, C5 or C6) to the diffusion path 9231. According to an embodiment, each path 9231, 9232 or 9233 may be provided in various shapes, and each input path 9232 or 9233 may be provided to be connected mutually via the diffusion path 9231. Accordingly, if an adhesive member separating solvent is inputted through the at least one solvent input region (B1, B2, B3, B4, C1, C2, C3, C4, C5 or C6), the solvent may be diffused into a corresponding location of the diffusion path 9231 via a plurality of the input paths 9232 and 9233, thereby achieving fast weakening of an adhesive strength of the adhesive member.

Figure 10:
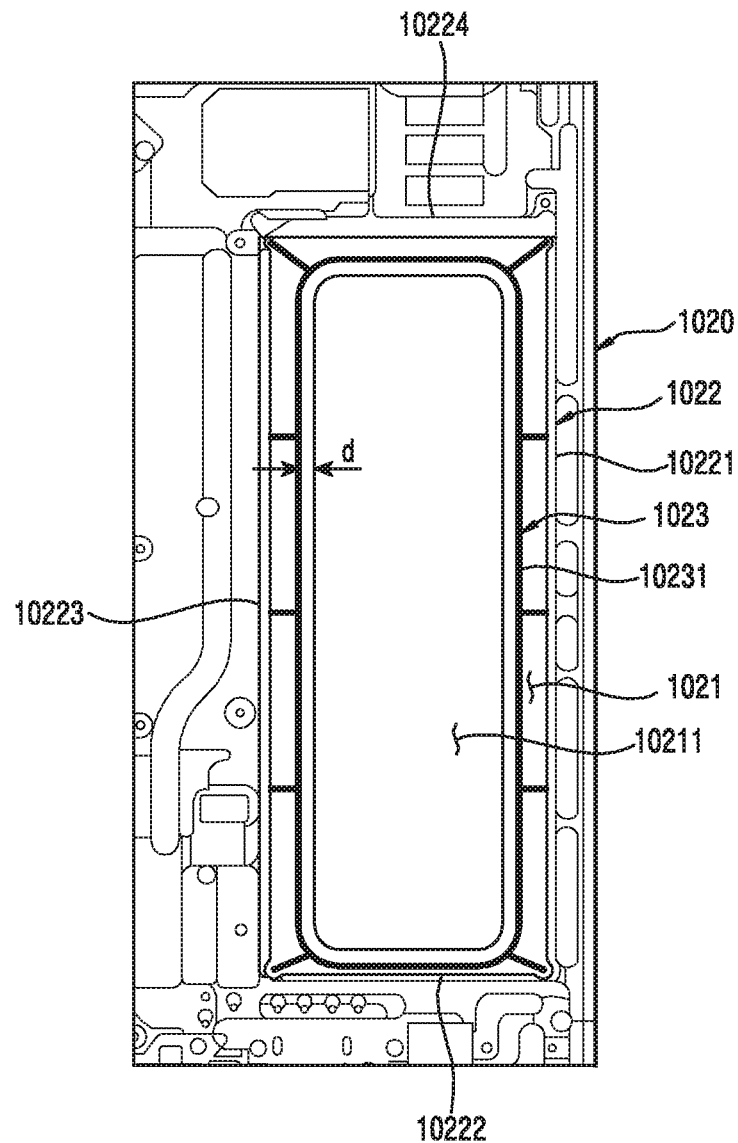
FIG. 10 is a diagram illustrating a construction of a housing according to various embodiments of the present disclosure.

FIG. 10 is a diagram illustrating a construction of a housing according to various embodiments of the present disclosure.

The housing 1020 of FIG. 10 may be similar to the housing 110 of FIG. 1, the housing 320 of FIG. 3, the housing 420 of FIG. 4 or the housing 520 of FIG. 5, or include other various embodiments of the housing.

Referring to FIG. 10, the housing 1020 may include a battery mounting portion 1021 for accepting a battery (e.g., the battery 440 of FIG. 4A). According to an embodiment, the battery mounting portion 1021 may be defined by a support rib 1022 that is extended a constant height upward from the housing 1020. According to an embodiment, the support rib 1022 may include a first support rib 10221 that is extended in a first direction and has a first length, a second support rib 10222 that is extended in a second direction perpendicular to the first direction and has a second length longer than the first length, a third support rib 10223 that is extended substantially in parallel with the first support rib 10221 and has the first length, and a fourth support rib 10224 that is extended in parallel with the second support rib 10222 and has the second length. According to an embodiment, the battery mounting portion 1021 may include a swelling hole 10211 that has a constant area and is capable of accepting a swelling phenomenon of the battery.

According to various embodiments, the battery mounting portion 1021 may include a recess 1023 that is provided lower than a safe mounting surface and has a constant depth and width. According to an embodiment, the recess 1023 may include a diffusion path 10231 that is provided to be distributed uniformly in a substantially overall region of the battery mounting portion 1021.

According to various embodiments, the diffusion path 10231 of the recess 1023 may be disposed in a scheme of surrounding the swelling hole 10211. According to an embodiment, the diffusion path 10231 may be provided close to the swelling hole 10211 with a criterion of a half of a distance from the inside of the support rib 1022 to the swelling hole 10211, but may be disposed to be spaced a spacing distance (d) apart in order not to connect with the swelling hole 10211. According to an embodiment, the spacing distance (d) may be defined as a range from zero from the swelling hole 10211 to a half or less of a distance (e.g., a width-direction distance) of the battery mounting portion 1021 as well. This is for preventing a problem that a peripheral electronic component (e.g., a display, etc.) is damaged if a solvent is excessively inputted and overflows into the swelling hole 10211 via the diffusion path 10231 of the recess 1023.

According to various embodiments, an etching line of a closed loop shape not connecting with the diffusion path 10231 or an embossing line (e.g., a rib) of a constant thickness (e.g., about 2.0 mm or more) is additionally formed along an edge of the swelling hole 10211 between the diffusion path 10231 of the recess 1023 and the swelling hole 10211, thereby being capable of preventing the overflow of the solvent.

Figure 11:
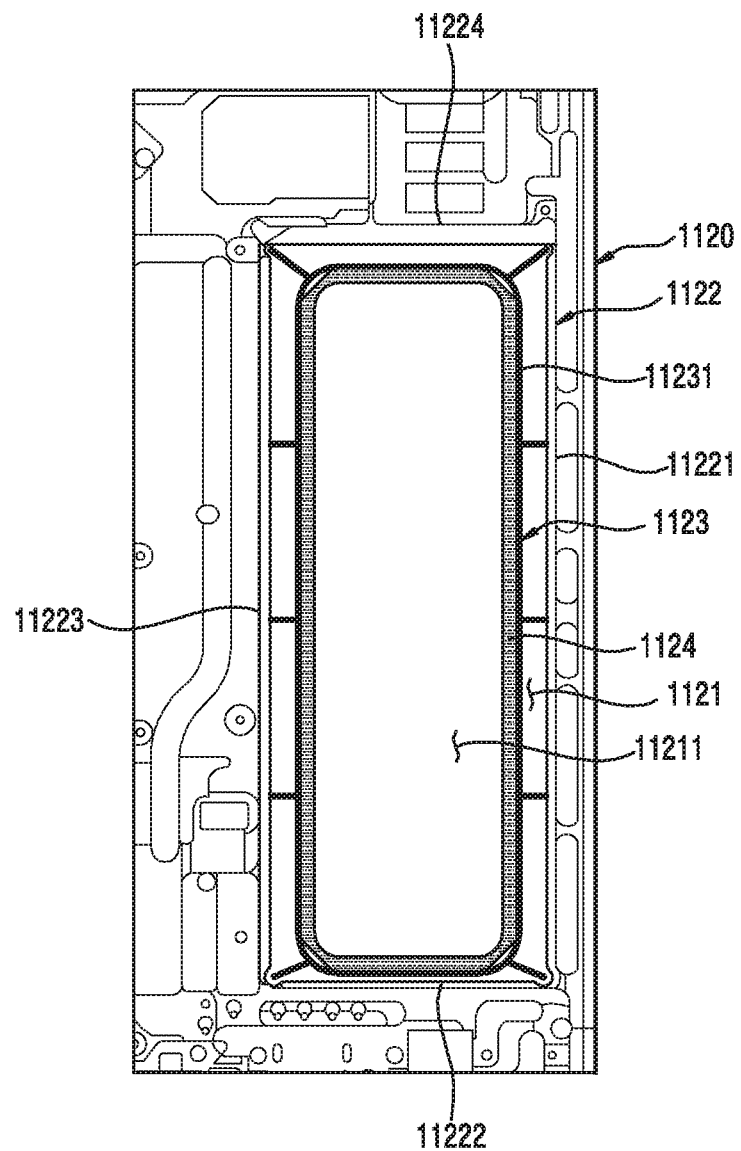
FIG. 11 is a diagram illustrating a construction of a housing according to various embodiments of the present disclosure.

FIG. 11 is a diagram illustrating a construction of a housing according to various embodiments of the present disclosure.

The housing 1120 of FIG. 11 may be similar to the housing 110 of FIG. 1, the housing 320 of FIG. 3, the housing 420 of FIG. 4, the housing 520 of FIG. 5 or the housing 920 of FIG. 9, or include other various embodiments of the housing.

Referring to FIG. 11, the housing 1120 may include a battery mounting portion 1121 for accepting a battery (e.g., the battery 440 of FIG. 4A). According to an embodiment, the battery mounting portion 1121 may be defined by a support rib 1122 that is extended a constant height upward from the housing 1120. According to an embodiment, the support rib 1122 may include a first support rib 11221 that is extended in a first direction and has a first length, a second support rib 11222 that is extended in a second direction perpendicular to the first direction and has a second length longer than the first length, a third support rib 11223 that is extended substantially in parallel with the first support rib 11221 and has the first length, and a fourth support rib 11224 that is extended in parallel with the second support rib 11222 and has the second length. According to an embodiment, the battery mounting portion 1121 may include a swelling hole 11211 that has a constant area and is capable of accepting a swelling phenomenon of the battery.

According to various embodiments, the battery mounting portion 1121 may include a recess 1123 that is provided lower than a safe mounting surface and has a constant depth and width. According to an embodiment, the recess 1123 may include a diffusion path 11231 that is provided to be distributed uniformly in a substantially overall region of the battery mounting portion 1121.

According to various embodiments, the diffusion path 11231 of the recess 1123 may be disposed in a scheme of surrounding the swelling hole 11211. According to an embodiment, the diffusion path 11231 may be provided close to the swelling hole 11211 with a criterion of a half of a distance from the inside of the support rib 1122 to the swelling hole 11211, but may be disposed to be spaced a distance apart in order not to connect with the swelling hole 11211.

According to various embodiments, a tape member 1124 having a constant thickness may be attached along an edge of the swelling hole 11211 between the diffusion path 11231 of the recess 1123 and the swelling hole 11211. According to an embodiment, the tape member 1124 may be formed of materials which do not react to a solvent for weakening a physical property of adhesiveness. According to an embodiment, the tape member 1124 may be attached thinly so that an adhesive strength may be weakened less than that of an adhesive member applied to the battery mounting portion 1121, to make battery separation easy after reaction of the functional member with a solvent. The tape member 1124 may be formed with a member of a soft physical property in order to prevent a physical property of viscosity of the functional adhesive member from being deteriorated due to a step caused by thickness deviation. According to an embodiment, the tape member 1124 may be applied to cover a spacing distance of 0.8 mm or more ranging from an edge of the swelling hole 11211 to the recess.

According to various embodiments, the tape member 1124 may be attached to the battery mounting portion 1121 of the housing 1120 or be attached to a corresponding outer surface of the housing 1120 facing the battery mounting portion 1121 or be attached to both surfaces of the housing 1120. According to an embodiment, the tape member attached to the corresponding outer surface of the housing 1120 may prevent a deterioration of the adhesive strength of the adhesive member for an electronic component or a direct damage of the electronic component, which may be generated by a solvent that overflows to at least one electronic component disposed in the corresponding outer surface of the housing 1120. According to an embodiment, the electronic component may include at least one of a display, a wireless charging member (e.g., a wireless power reception coil) or an antenna member (e.g., an NFC antenna member, etc.). According to an embodiment, instead of the tape member 1124, a hydrophilic or hydrophobic coating layer may be coated on a corresponding region as well. Or, instead of the adhesive member, an anti-overflow rib extended a constant height may be applied to the battery mounting portion or a corresponding outer surface as well.

Figure 12:
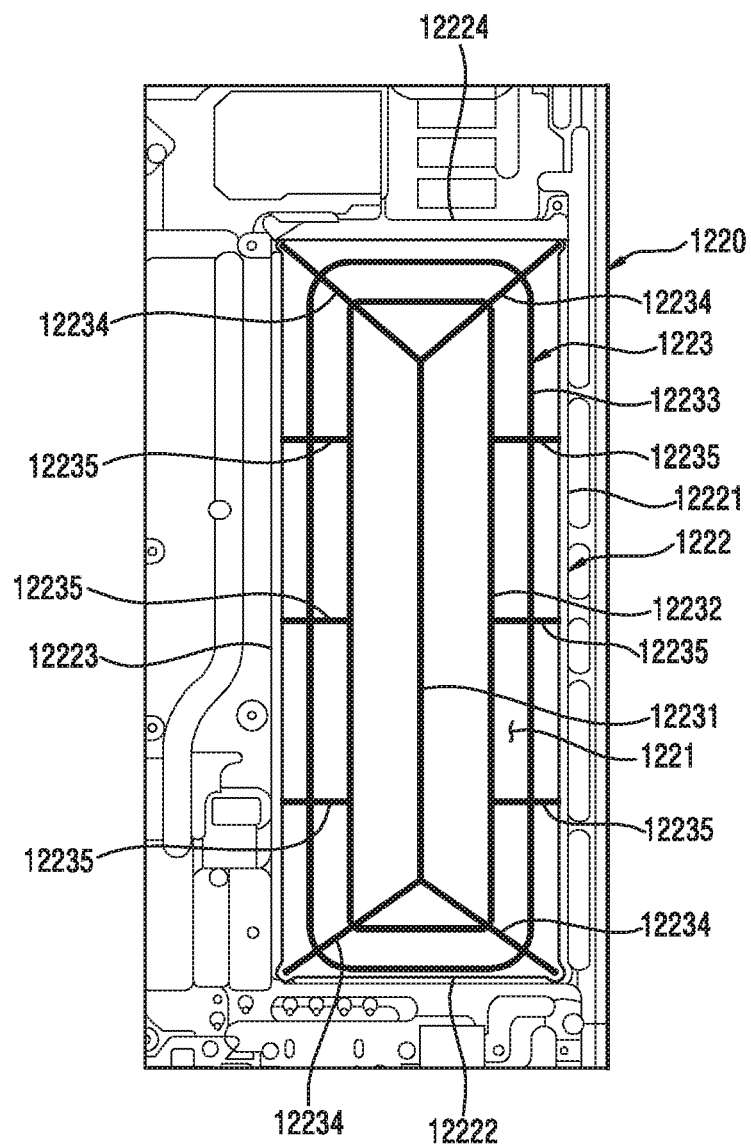
FIG. 12 is a diagram illustrating a construction of a housing according to various embodiments of the present disclosure.

FIG. 12 is a diagram illustrating a construction of a housing according to various embodiments of the present disclosure.

The housing 1220 of the FIG. 12 may be similar to the housing 110 of FIG. 1, or include other various embodiments of the housing.

Referring to FIG. 12, the housing 1220 may include a battery mounting portion 1221 for accepting a battery (e.g., the battery 440 of FIG. 4A). According to an embodiment, the battery mounting portion 1221 may be defined by a support rib 1222 that is extended a constant height upward from the housing 1220. According to an embodiment, the support rib 1222 may include a first support rib 12221 that is extended in a first direction and has a first length, a second support rib 12222 that is extended in a second direction perpendicular to the first direction and has a second length longer than the first length, a third support rib 12223 that is extended substantially in parallel with the first support rib 12221 and has the first length, and a fourth support rib 12224 that is extended in parallel with the second support rib 12222 and has the second length. According to an embodiment, the battery mounting portion 1221 may be formed to have a closed surface in which a separate opening (e.g., a swelling hole) does not exist.

According to various embodiments, the battery mounting portion 1221 may include a recess 1223 that is provided lower than a safe mounting surface and has a constant depth and width. According to an embodiment, the recess 1223 may include a first diffusion path 12231 that is disposed in a length direction in a substantially center region of the battery mounting portion 1221, a loop type second diffusion path 12232 that is disposed to be spaced a constant interval apart in a scheme of surrounding the first diffusion path 12231, a loop type third diffusion path 12233 that is disposed to be spaced a constant interval apart in a scheme of surrounding the loop type second diffusion path 12232, and a plurality of input paths 12234 and 12235 which are simultaneously connected with the first, second and third diffusion paths 12231, 12232 and 12233, and of which the ending portions are formed extending up to the support rib 1222, and which accept an inputted solvent. According to an embodiment, the recess 1223 may be provided to have four or more diffusion paths according to a size and shape of the battery mounting portion 1221, and the input path 12234 or 12235 may be set in various schemes, too.

Figure 13A:
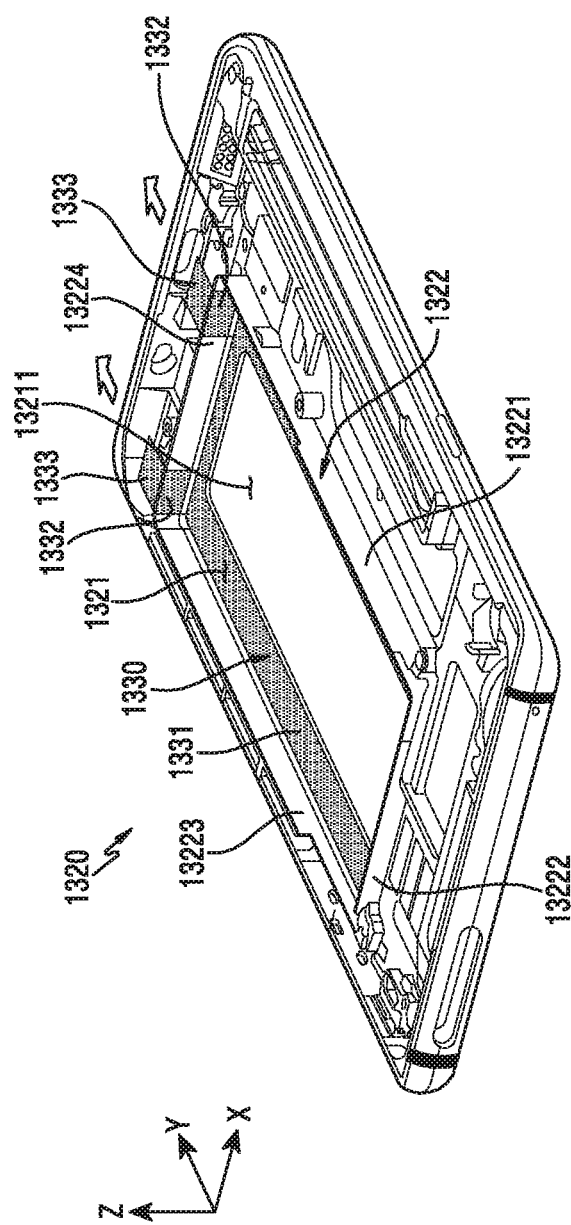
FIG. 13A is a diagram illustrating a construction of a housing to which a functional adhesive member is applied according to various embodiments of the present disclosure.
Figure 13B:
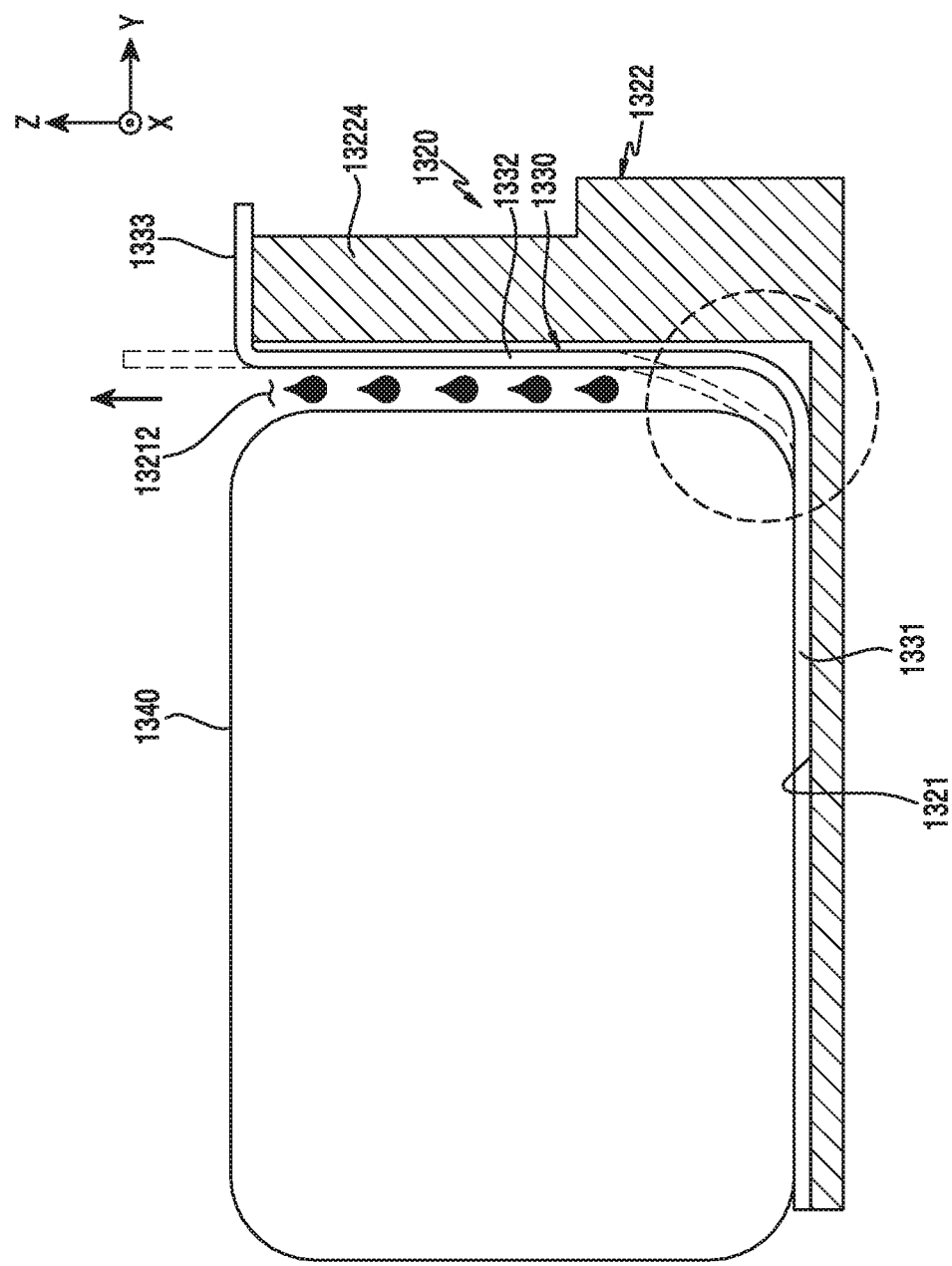
FIG. 13B is a diagram illustrating a battery separation operation that uses the functional adhesive member of FIG. 13A according to various embodiments of the present disclosure.

FIGS. 13A and 13B are diagrams illustrating a construction of a housing to which a functional adhesive member is applied according to various embodiments of the present disclosure.

Referring to FIGS. 13A and 13B, the housing 1320 may include a battery mounting portion 1321 for accepting a battery 1340. According to an embodiment, the battery mounting portion 1321 may be defined by a support rib 1322 that is extended a constant height upward from the housing 1320. According to an embodiment, the support rib 1322 may include a first support rib 13221 that is extended in a first direction and has a first length, a second support rib 13222 that is extended in a second direction perpendicular to the first direction and has a second length longer than the first length, a third support rib 13223 that is extended substantially in parallel with the first support rib 13221 and has the first length, and a fourth support rib 13224 that is extended in parallel with the second support rib 13222 and has the second length. According to an embodiment, the battery mounting portion 1321 may include a swelling hole 13211 that has a constant area and is capable of accepting a swelling phenomenon of the battery.

According to various embodiments, a functional adhesive member 1330 may be attached to the battery mounting portion 1321. According to an embodiment, the functional adhesive member 1330 may include an adhesive part 1331 that is disposed in the battery mounting portion 1321, a connection part 1332 that is extended from at least one region of the adhesive part 1331, and a tab 1333 that is extended from the connection part 1332 and is exposed outside the battery mounting portion 1321. According to an embodiment, the functional adhesive member 1330 may include a member that is decreased in its adhesiveness area if a tension works in a shear direction (e.g., a Y-axis direction) vertical with a battery mounting direction (e.g., −Z-axis direction) and is deteriorated in its adhesiveness physical property. The functional adhesive member 1330 may include a pair of the tabs 1333 that are withdrawn a constant length climbing over the fourth support rib 13224 through the connection part 1332 of the support rib 1322. According to an embodiment, the battery 1340 may be separated from the housing 1320 by drawing the tab 1333 in a Y-axis direction to gradually decrease a contact area of the battery 1340 and the housing 1320. But, during this process, the tab 1333 may not be pulled in the shear direction (e.g., Y-axis direction) due to the fourth support rib 13224 of a constant height that is formed for the purpose of rigidity reinforcement and battery protection. Because of this, a frictional force is generated at a corner portion (a dotted-line portion of FIG. 13B) of the battery 1340, and this frictional force may cause a fracture of the functional adhesive member 1330 and thus a malfunction thereof.

According to various embodiments, before the functional adhesive member 1330 is pulled in the shown Y-axis direction by avoiding the fourth support rib 13224, the housing 1320 may accept a solvent (e.g., alcohol) that is inputted to the connection part 1332 in a space 13212 between the battery 1340 and the fourth support rib 13224. This solvent may attenuate a frictional force which may be generated between the battery 1340 and the connection part 1332 when the tab 1333 is pulled at a corner (i.e., a shown dotted-line portion of FIG. 13B) of the battery 1340. By this, the solvent may lead easy separation of the battery 1340 without a fracture of the functional adhesive member 1330.

According to various embodiments, a component attached to a self-structure of an adherent (e.g., a housing) may be easily separated by only the self-structure of the adherent, fast maintenance is possible, and a damage of a peripheral component may be prevented, and contribution may be made to the slimming of an electronic device.

According to various embodiments, an electronic device may be provided. The electronic device may include a housing having a first surface and a second surface facing away from the first surface, a display of which at least part of the display is disposed in the housing in a second surface direction, and a battery of which at least part of the battery is disposed in the housing in a first surface direction. The housing may include a battery mounting portion whose recess is provided in the first surface. The battery may be attached to the battery mounting portion by an adhesive member.

According to various embodiments, the recess may include at least one diffusion path substantially surrounding the battery mounting portion, and at least one solvent input path of which a first end portion is connected with the at least one diffusion path, and a second end portion is extended up to an edge of the battery mounting portion.

According to various embodiments, the at least one diffusion path may be used for diffusing a solvent inputted through the at least one solvent input path, to separate the adhesive member from a corresponding region of the battery mounting portion.

According to various embodiments, the recess may be provided to have a constant depth and width lower than a mounting surface of the battery mounting portion.

According to various embodiments, a section of the recess may be formed as a groove of an inverted triangle shape of which the width is gradually decreased over a length of the section of the recess.

According to various embodiments, a section of the recess may be formed as a groove of which the bottom surface is a curved shape or plane shape.

According to various embodiments, the recess may have at least two paths that are provided continuously in a width direction.

According to various embodiments, the battery mounting portion may have at least one opening that is substantially surrounded by the recess.

According to various embodiments, an anti-overflow member may be formed between the recess and an edge of the at least one opening, to prevent the overflow of a solvent that is used for decreasing an adhesive strength of the adhesive member.

According to various embodiments, the anti-overflow member may include a tape member constructed of a material that does not react to the solvent.

According to various embodiments, the tape member may be attached to the first surface of the housing.

According to various embodiments, at least part of the anti-overflow member may have an etching-line or embossing-shape rib between the recess and the edge of the at least one opening.

According to various embodiments, the anti-overflow member may include a hydrophobic coating layer or hydrophilic coating layer that is disposed between the recess and the edge of the at least one opening.

According to various embodiments, the housing may include a support rib that is extended a constant height along an edge of the battery mounting portion, and the support rib may include a first support rib extended in a first direction and having a first length, a second support rib extended in a second direction perpendicular to the first direction and having a second length longer than the first length, a third support rib extended substantially in parallel with the first support rib and having the first length, and a fourth support rib extended in parallel with the second support rib and having the second length.

According to various embodiments, the first support rib, the second support rib, the third support rib, and the fourth support rib may include at least one solvent input slot for guiding, to the recess, a solvent that is inputted to decrease an adhesive strength of the adhesive member.

According to various embodiments, the solvent input slot may be provided in a funnel shape which is connected with the recess and of which the input space is widened over a length of the solvent input slot.

According to various embodiments, the solvent input slot may include an input path that is connected with the recess and is formed in an inner wall of the support rib.

According to various embodiments, the solvent input slot may include an input path that is connected with the recess and is formed to extend up to a step part formed a constant height lower than the support rib in an inner wall of the support rib.

According to various embodiments, a first member, a second member attached to the first member by an adhesive member, and a recess for guiding a flow of a solvent for decreasing an adhesive strength of the adhesive member, to at least a part of a region, which overlaps with the second member, among one surface of the first member may be formed.

According to various embodiments, the first member may include a battery, and the second member may include a housing in which the battery is disposed.

Various embodiments of the present disclosure disclosed in the specification and the drawings merely propose specific examples so as to easily explain a technological substance according to an embodiment of the present disclosure and help the understanding of an embodiment of the present disclosure, and do not intend to limit the scope of an embodiment of the present disclosure. Accordingly, the scope of the various embodiments of the present disclosure should be construed as including all modified or changed forms that are drawn on the basis of the technological spirit of the various embodiments of the present besides various embodiments disclosed herein.

While the present disclosure has been shown and described with reference to various embodiments thereof, it will be understood by those skilled in the art that various changes in form and details may be made therein without departing from the spirit and scope of the present disclosure as defined by the appended claims and their equivalents.

What is claimed is:
1. An electronic device comprising:
a housing including a first surface and a second surface facing away from the first surface;
a display of which at least part of the display is disposed in the housing on the second surface; and
a battery of which at least part of the battery is disposed in the housing on the first surface,
wherein the housing comprises a battery mounting portion including a recess disposed in the first surface,
wherein the battery is attached to the battery mounting portion by an adhesive member,
wherein the battery mounting portion is defined by a support rib, which includes at least one solvent input slot, and
wherein the recess is connected to the at least one solvent input slot, and the recess is arranged to diffuse a solvent provided from the at least one solvent input through the recess to decrease an adhesive strength of the adhesive member.

2. The electronic device of claim 1, wherein the recess comprises:
at least one diffusion path substantially surrounding the battery mounting portion; and
at least one solvent input path of which a first end portion is connected with the at least one diffusion path, and a second end portion is extended up to an edge of the battery mounting portion.

3. The electronic device of claim 2, wherein the at least one diffusion path diffuses a solvent inputted through the at least one solvent input path, to separate the adhesive member from a corresponding region of the battery mounting portion.

4. The electronic device of claim 1, wherein the recess is provided to have a constant depth and width and is provided lower than a mounting surface of the battery mounting portion.

5. The electronic device of claim 1, wherein a section of the recess is formed as a groove of an inverted triangle shape of which the width is gradually decreased over a length of the section of the recess.

6. The electronic device of claim 1, wherein a section of the recess is formed as a groove of which the bottom surface is a curved shape or plane shape.

7. The electronic device of claim 1, wherein the recess has at least two paths that are provided continuously along a width of the electronic device.

8. The electronic device of claim 1, wherein the battery mounting portion has a swelling hole that is substantially surrounded by the recess.

9. The electronic device of claim 8, wherein an anti-overflow member is formed between the recess and an edge of the at least one opening, and prevents the overflow of a solvent that is used for decreasing an adhesive strength of the adhesive member.

10. The electronic device of claim 9, wherein the anti-overflow member comprises a tape member constructed of a material that does not react to the solvent.

11. The electronic device of claim 10, wherein the tape member is attached to the first surface of the housing.

12. The electronic device of claim 9, wherein at least part of the anti-overflow member forms an etching-line or embossing-shape rib between the recess and the edge of the at least one opening.

13. The electronic device of claim 9, wherein the anti-overflow member comprises a hydrophobic coating layer or hydrophilic coating layer that is disposed between the recess and the edge of the at least one opening.

14. The electronic device of claim 1, wherein the support rib is extended a constant height along an edge of the battery mounting portion, and the support rib comprises:
a first support rib extended in a first direction and having a first length;
a second support rib extended in a second direction perpendicular to the first direction and having a second length longer than the first length;
a third support rib extended substantially in parallel with the first support rib and having the first length; and
a fourth support rib extended in parallel with the second support rib and having the second length.

15. The electronic device of claim 14, wherein the first support rib, the second support rib, the third support rib, and the fourth support rib comprise at least one solvent input slot for guiding, to the recess, a solvent that is inputted to decrease an adhesive strength of the adhesive member.

16. The electronic device of claim 15, wherein the solvent input slot is provided in a funnel shape which is connected with the recess and of which the input space is widened over a length of the solvent input slot.

17. The electronic device of claim 15, wherein the solvent input slot comprises an input path that is connected with the recess and is formed in an inner wall of the support rib.

18. The electronic device of claim 15, wherein the solvent input slot comprises an input path that is connected with the recess and is formed to extend up to a step part formed a constant height lower than the support rib in an inner wall of the support rib.

19. An electronic device comprising:
a first member;
a second member attached to the first member by an adhesive member; and
a recess for guiding a flow of a solvent for decreasing an adhesive strength of the adhesive member, to at least a part of a region among one surface of the first member which overlaps with the second member,
wherein the region is defined by a support rib, which includes at least one solvent input slot, and
wherein the recess is connected to the at least one solvent input slot, and the recess is arranged to diffuse the solvent provided from the at least one solvent input slot through the recess.

20. The electronic device of claim 19, wherein the first member comprises a battery, and the second member comprises a housing in which the battery is disposed.

* * * * *